US012632639B2

(12) United States Patent
Korchemny et al.

(10) Patent No.: US 12,632,639 B2
(45) Date of Patent: May 19, 2026

(54) OPTIMIZATION OF ALTERNATING BÜCHI AUTOMATA FOR FORMAL VERIFICATION OF A CIRCUIT DESIGN

(71) Applicant: Synopsys, Inc., Mountain View, CA (US)

(72) Inventors: Dmitry Korchemny, Kfar Saba (IL); Naphtali Yehoshua Sprei, Modi'in-Maccabim-Re'ut (IL)

(73) Assignee: Synopsys, Inc., Sunnyvale, CA (US)

( * ) Notice: Subject to any disclaimer, the term of this patent is extended or adjusted under 35 U.S.C. 154(b) by 845 days.

(21) Appl. No.: 17/859,649

(22) Filed: Jul. 7, 2022

(65) Prior Publication Data

US 2023/0017872 A1 Jan. 19, 2023

Related U.S. Application Data

(60) Provisional application No. 63/220,367, filed on Jul. 9, 2021.

(51) Int. Cl.
*G06F 30/398* (2020.01)

(52) U.S. Cl.
CPC .................................. *G06F 30/398* (2020.01)

(58) Field of Classification Search
CPC .... G06F 30/3323; G06F 30/398; G06F 30/20; G06F 30/30; G06F 30/33; G06F 2119/16; G06F 30/337; G06F 11/263; G06F 11/3608; G06F 30/17; G06F 30/23; G06F 30/323; G06F 30/333; G06F 30/327; G06F 11/3684; G06F 2119/18; G06F 9/3016; G06F 9/3836

USPC ................................................... 716/100–106
See application file for complete search history.

(56) References Cited

U.S. PATENT DOCUMENTS

| | | | | | |
|---|---|---|---|---|---|
| 8,225,249 | B1 * | 7/2012 | Martensson | ........ | G06F 30/3323 |
| | | | | | 716/106 |
| 2014/0372967 | A1 * | 12/2014 | Armoni | ............... | G06F 30/3323 |
| | | | | | 717/104 |
| 2017/0107413 | A1 * | 4/2017 | Wang | ................... | C09D 183/00 |

(Continued)

OTHER PUBLICATIONS

Leucker, M. et al. "Regular Linear Temporal Logic." Proceedings of the 4th International Conference on Theoretical Aspects of Computing, Sep. 26, 2007, pp. 291-305.

(Continued)

*Primary Examiner* — Binh C Tat
(74) *Attorney, Agent, or Firm* — Fenwick & West LLP

(57) ABSTRACT

A system receives assertions representing properties of a circuit design. The system determines a representation of an alternating Büchi automaton based on the assertions. The system transforms the representation of the alternating Büchi automaton to generate a representation of a simplified alternating Büchi automaton. The simplified alternating Büchi automaton has fewer states than the alternating Büchi automaton. One or more states of the simplified alternating Büchi automaton are obtained by merging states of the alternating Büchi automaton representing the assertions of the circuit. The system performs formal verification of the circuit design using the simplified alternating Büchi automaton.

18 Claims, 35 Drawing Sheets

200

(56) References Cited

U.S. PATENT DOCUMENTS

2018/0157776 A1* 6/2018 Cerny .................. G06F 30/398

OTHER PUBLICATIONS

Pnueli, A. "The Temporal Logic of Programs." 18th Annual Symposium Foundations of Computer Science, Oct. 31-Nov. 2, 1977, pp. 46-57.

Vardi, M. Y. "An Automata-Theoretic Approach to Linear Temporal Logic." Proceedings of the VIII Banff Higher Order Workshop Conference on Logics for Concurrency: Structure versus Automata, Apr. 1, 1996, pp. 238-266.

* cited by examiner

200

210
Receive circuit design and assertions

220
Generate an alternating Büchi Automaton based on assertions

230
Transform Büchi Automaton to generate a simplified Büchi Automaton with fewer states

240
Perform formal verification of circuit design using simplified Büchi Automaton

400

410

410 a and b = false

1700

OPTIMIZATION OF ALTERNATING BÜCHI AUTOMATA FOR FORMAL VERIFICATION OF A CIRCUIT DESIGN

CROSS REFERENCE TO RELATED APPLICATIONS

This application claims a benefit of U.S. Patent Application Ser. No. 63/220,367, filed Jul. 9, 2021, the contents of which are incorporated by reference herein in its entirety.

TECHNICAL FIELD

The present disclosure relates to design of electronic circuits in general, and more specifically to optimization of alternating Büchi automata associated with a circuit design, for example, for formal verification of the circuit design.

BACKGROUND

Formal verification of circuit designs is performed using dedicated formal specification languages. These languages may be built using Linear Time Logic (LTL) or Regular Linear Temporal Logic (RLTL). RLTL languages may be reduced to finite automata on infinite words, also referred to as Büchi automata. A Büchi automaton includes a set of states and a transition function which determines which state the machine should move to from its current state when it reads the next input. The Büchi automaton either accepts or rejects infinite inputs. Typically, an alternating variant of Büchi automata referred to as ABW (Alternating Büchi automata on Words) is built. A nondeterministic Büchi automaton is a special case of ABW. An alternating Büchi automaton that is automatically generated based on assertions for a circuit design can be very large, having a large number of states and transitions. Performing formal verification using such a large alternating Büchi automata is computationally inefficient.

SUMMARY

A system receives assertions representing properties of a circuit design. The system determines a representation of an alternating Büchi automaton based on the assertions. The system transforms the representation of the alternating Büchi automata to generate a representation of a simplified alternating Büchi automata. The simplified alternating Büchi automaton has fewer states than the alternating Büchi automata. One or more states of the simplified alternating Büchi automaton are obtained by merging states of the alternating Büchi automata representing the assertions of the circuit. The system performs formal verification of the circuit design using the simplified alternating Büchi automata.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

Figure (FIG. 1 illustrates the system environment for simplifying alternating Büchi automatons, according to an embodiment.

DETAILED DESCRIPTION

Figure 1:
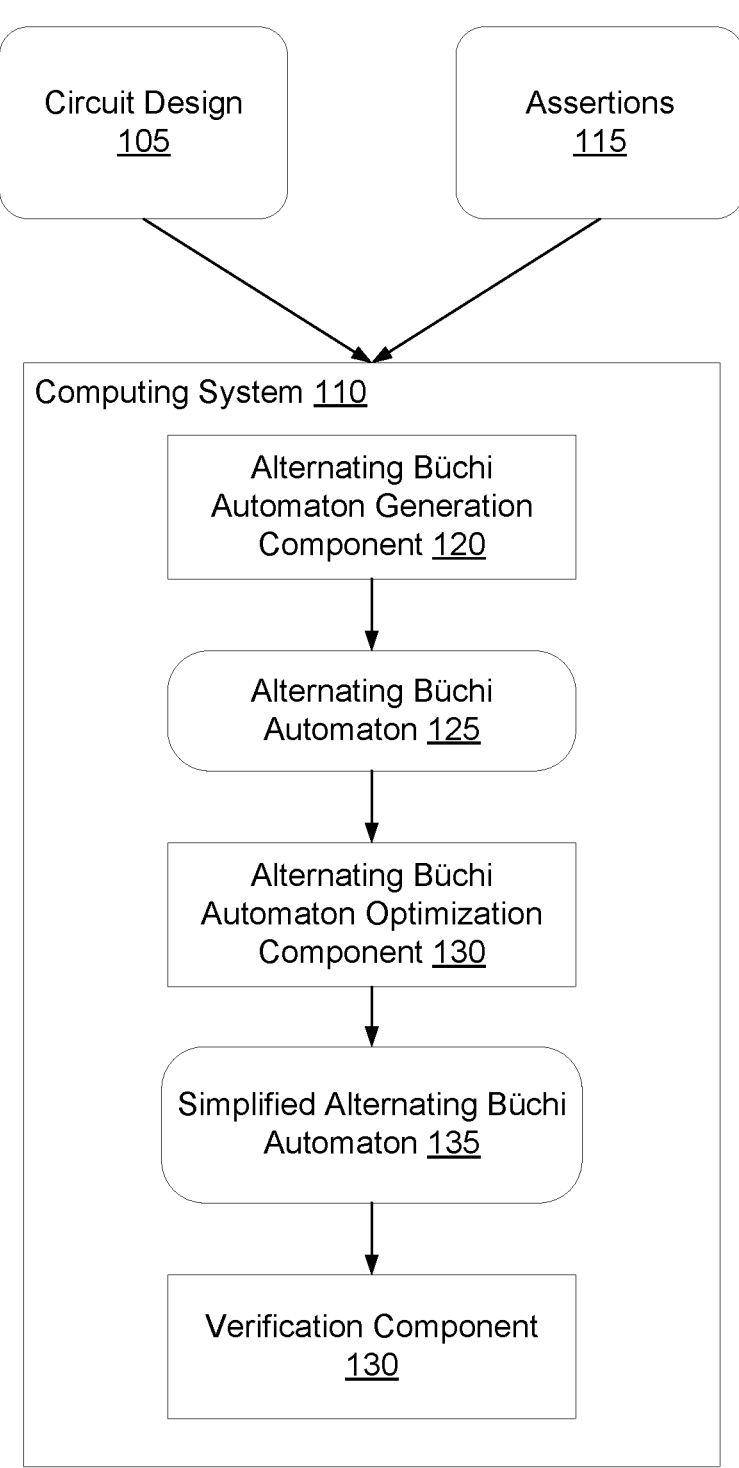
Figure 18:
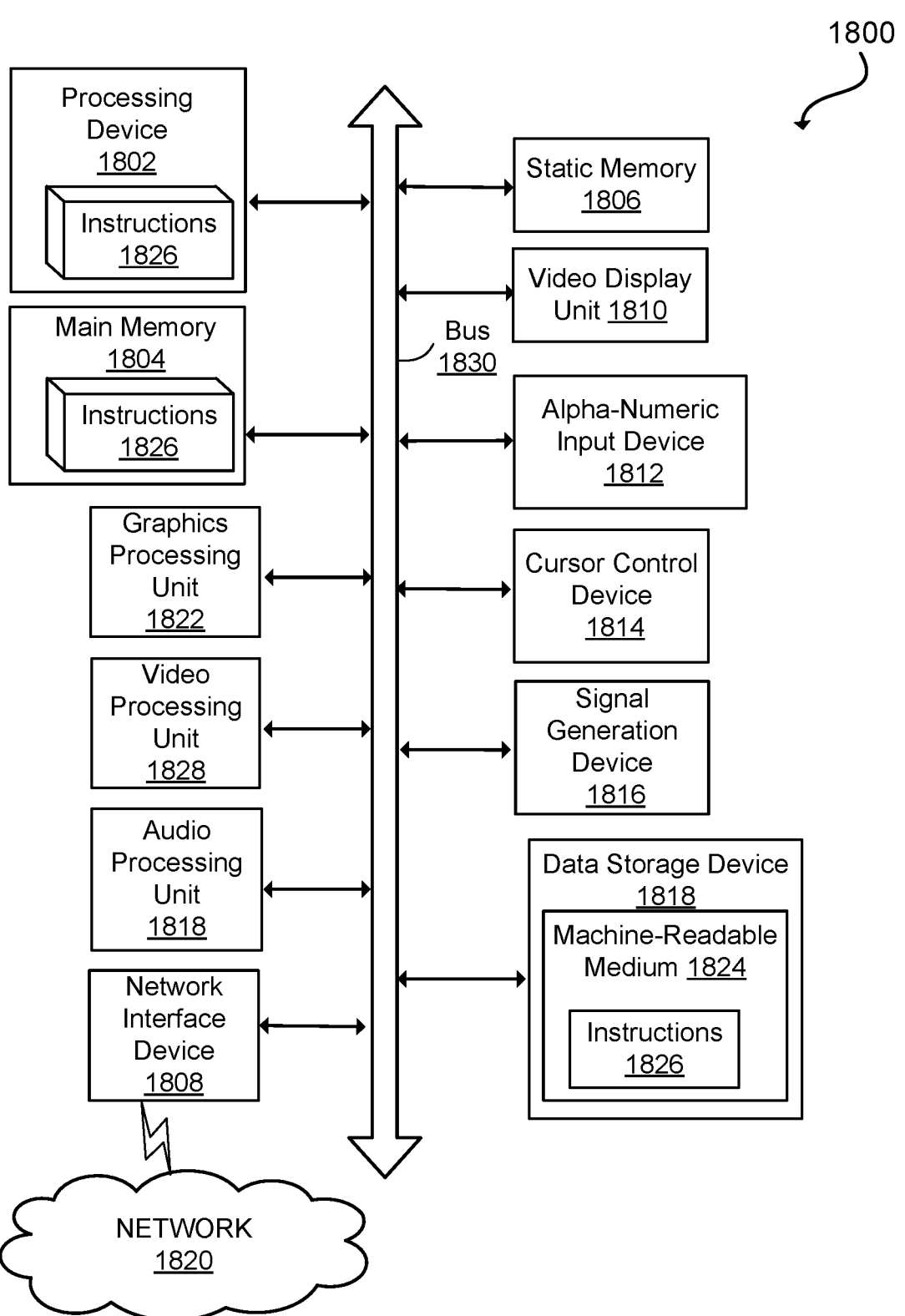
FIG. 18 depicts a diagram of an example computer system in which embodiments of the present disclosure may operate.

FIG. 1 illustrates the system environment for simplifying ABWs, according to an embodiment. The system environment includes a computing system 110 that may be referred to herein as a system. According to various embodiments, the computing system 110 that processes the components shown in FIG. 1 is a processing device (or a computer processor) as shown in FIG. 18. The alternating Büchi automaton generation component 120 receives the assertions 115 representing properties of a circuit design 105. An example of an assertion is "assert property (req|→gnt);" indicating that each request req is eventually granted (i.e., gnt is received). The alternating Büchi automaton generation component 120 generates an alternating Büchi automaton 125 representing each assertion. The alternating Büchi automaton optimization component 120 receives the generated alternating Büchi automaton 125 and simplifies it to generate the simplified alternating Büchi automaton 135 that has fewer states compared to the alternating Büchi automaton 125.

The simplified alternating Büchi automaton 135 is processed by the subsequent stages of the circuit design and analysis process. For example, the verification component 130 performs formal analysis of circuit designs using the simplified alternating Büchi automaton 135. The verification component 130 takes a model of the design and the (alternating) Büchi automaton of an assertion and either (1) builds a counterexample whose language is accepted both by the model and by the Büchi automaton or (2) proves that no such a counterexample exists. The techniques disclosed herein may be applied to any alternating Büchi automaton in a context of any application. The technique is also applicable to nondeterministic and universal Büchi automata that represent special cases of alternating Büchi automata.

Figure 2:
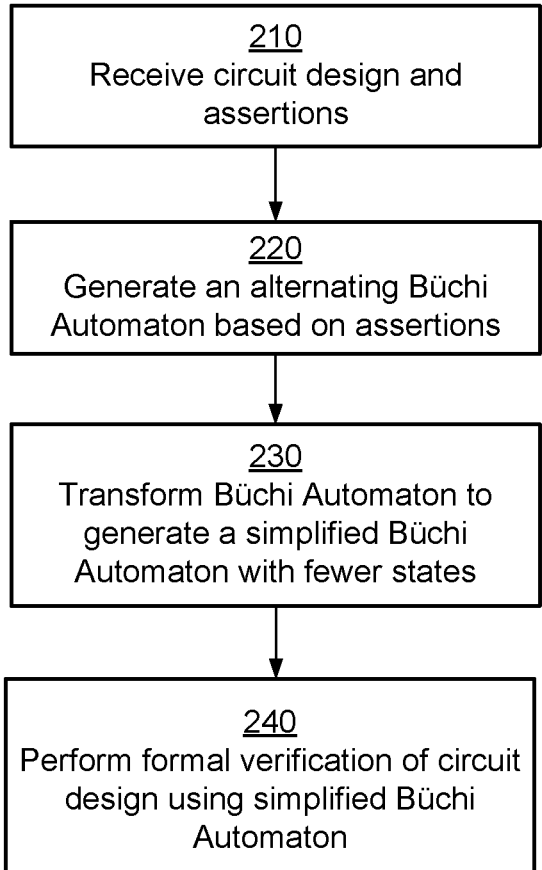
FIG. 2 shows a flowchart that illustrates the overall process of simplifying alternating Büchi automata, according to an embodiment.

FIG. 2 shows a flowchart that illustrates the overall process 200 of simplifying alternating Büchi automata, according to an embodiment. In step 210, the system receives one or more assertions representing properties of a circuit design. In step 220, the system generates a representation of an alternating Büchi automaton based on the assertions. In step 230, the system transforms the representation of the alternating Büchi automata to generate a representation of a simplified alternating Büchi automata. The system may simplify an alternating Büchi automaton to generate a simplified alternating Büchi automaton with fewer states compared to the original alternating Büchi automata. In step 240, the system performs formal verification of the circuit design using the simplified alternating Büchi automata.

Size reduction of the ABW improves the performance as well as convergence of formal verification of circuit designs. Some systems place a time limit on formal verification and determine that the formal verification failed to converge if the execution of formal verification process exceeds the time limit. Accordingly, the formal verification process may be stopped if the time limit is exceeded. The technique disclosed herein improves the efficiency of execution of the process of formal verification since fewer states of the ABW need to be processed. Furthermore, a formal verification process that fails to converge without use of the techniques disclosed herein may be able to converge when these techniques are used.

Figure 3A:
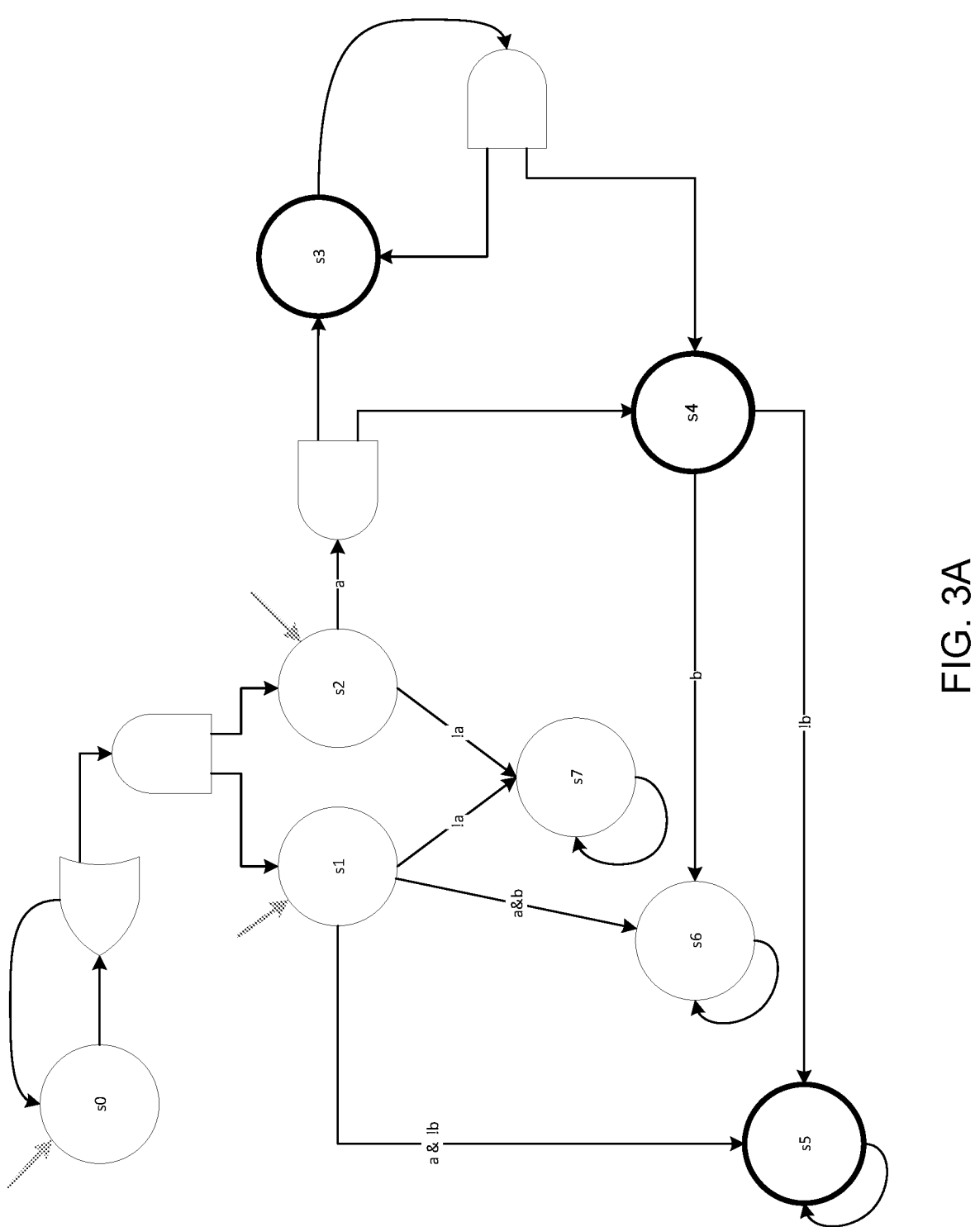
FIG. 3A illustrates an example alternating Büchi automaton generated from an assertion, according to an embodiment.
Figure 3B:
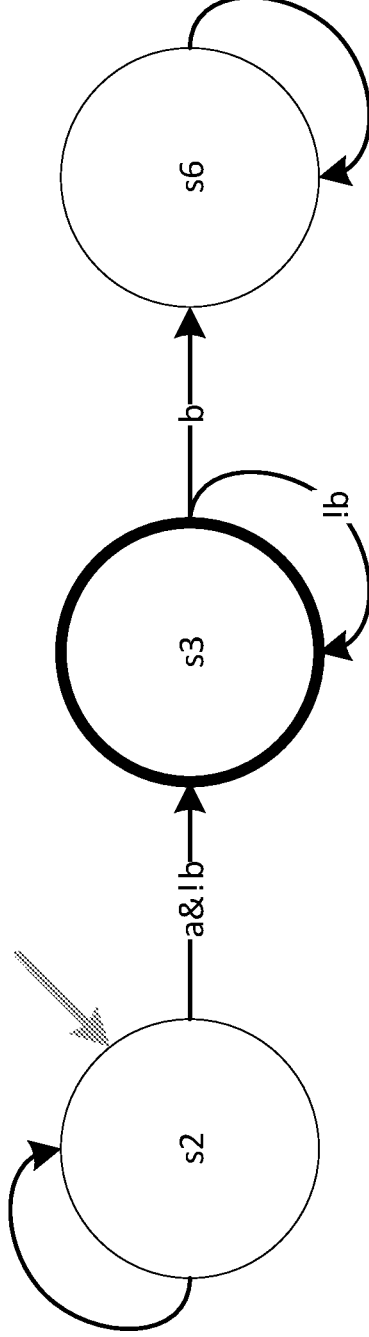
FIG. 3B illustrates an alternating Büchi automaton obtained by simplifying the ABW shown in FIG. 3A, herein according to an embodiment.

FIG. 3A illustrates an example alternating Büchi automaton generated from an assertion, according to an embodiment. The circles in the diagram represents states; an AND gate represents a universal transition; an OR gate represents an existential transition; a circuit representing a state with a thick border represents an accepting state; and states with incoming arrows represent initial states. A universal transition moves an alternating automaton to all its target states simultaneously, while an existential transition moves an alternating automaton to one of its target states. FIG. 3B illustrates an alternating Büchi automaton obtained by simplifying the ABW shown in FIG. 3A based on processes disclosed herein according to an embodiment. The ABW depicted in FIG. 3A and in FIG. 3B recognize the same language, namely the language defined by SystemVerilog assertion (SVA) assert property (a|$\rightarrow$s_eventually b). This assertion states that for each time when variable a is true, either simultaneously or in some future instant, variable b must also assume value true. An ABW state with only outgoing edge that is a self-loop is called a sink state. In FIG. 3A state $s_5$ is an accepting sink state, states $s_6$ and $s_7$ are non-accepting sink states.

Figure 15A:
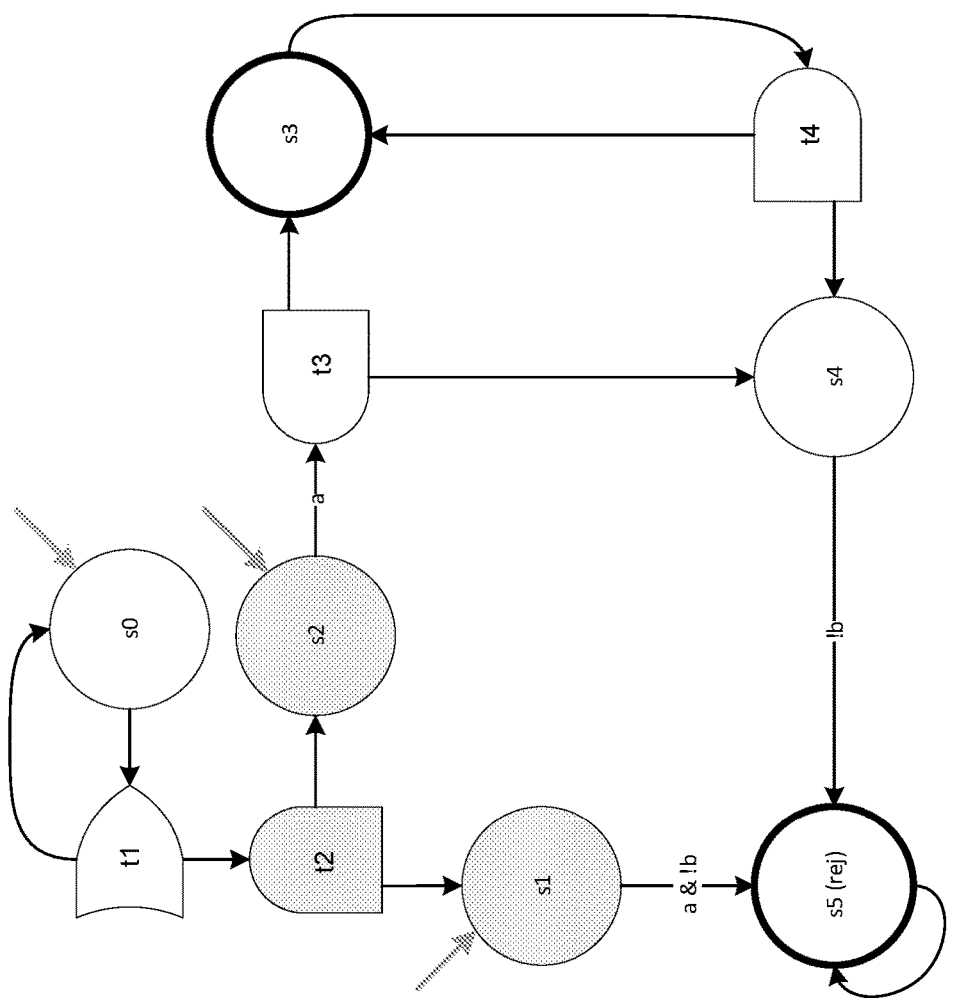
FIGS. 15A-15G illustrate simplifications performed to an example ABW based on the process shown in FIG. 4 according to an embodiment.
Figure 15B:
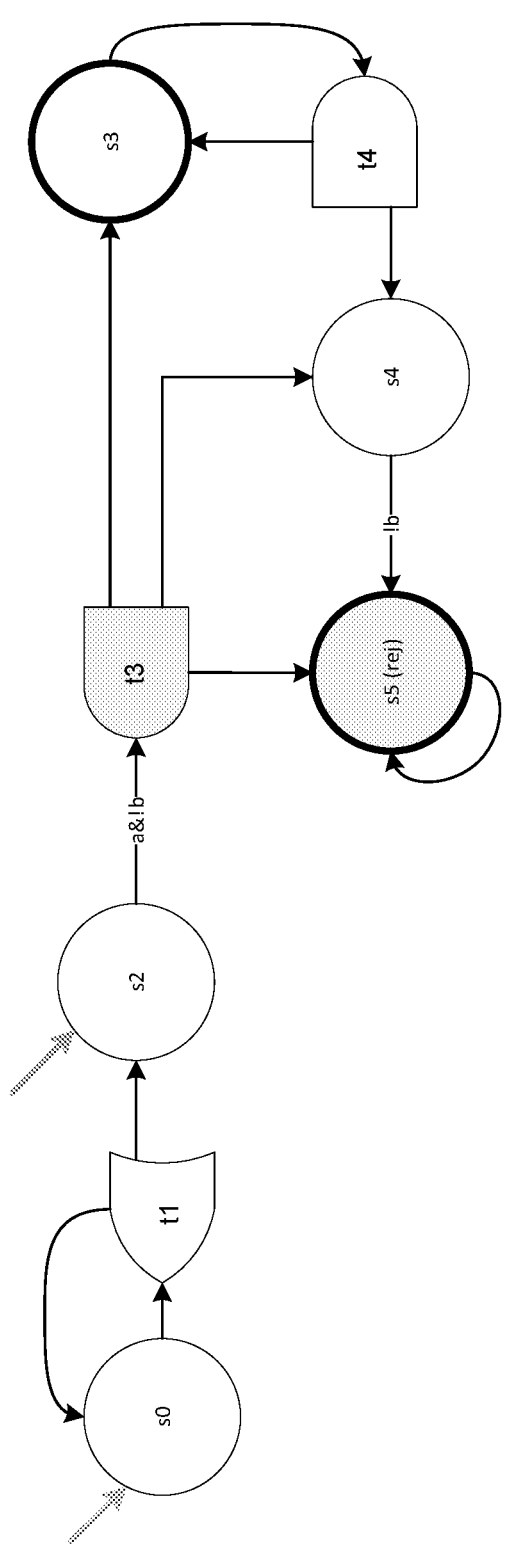
Figure 15C:
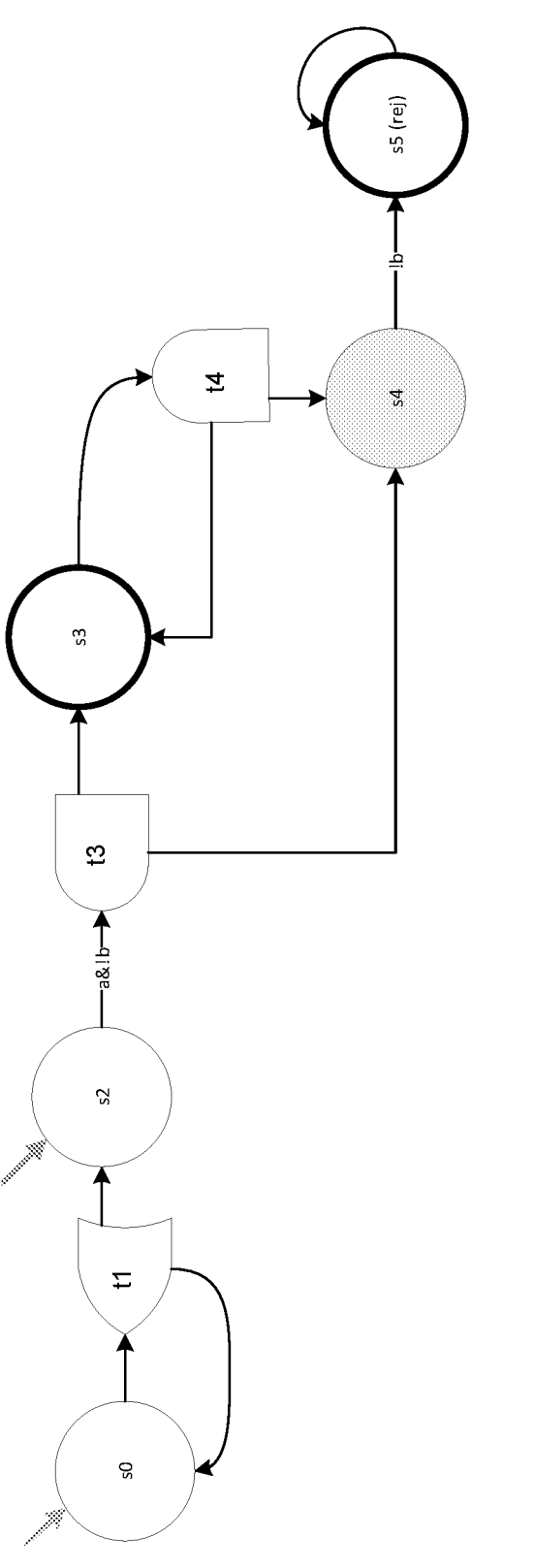
Figure 15D:
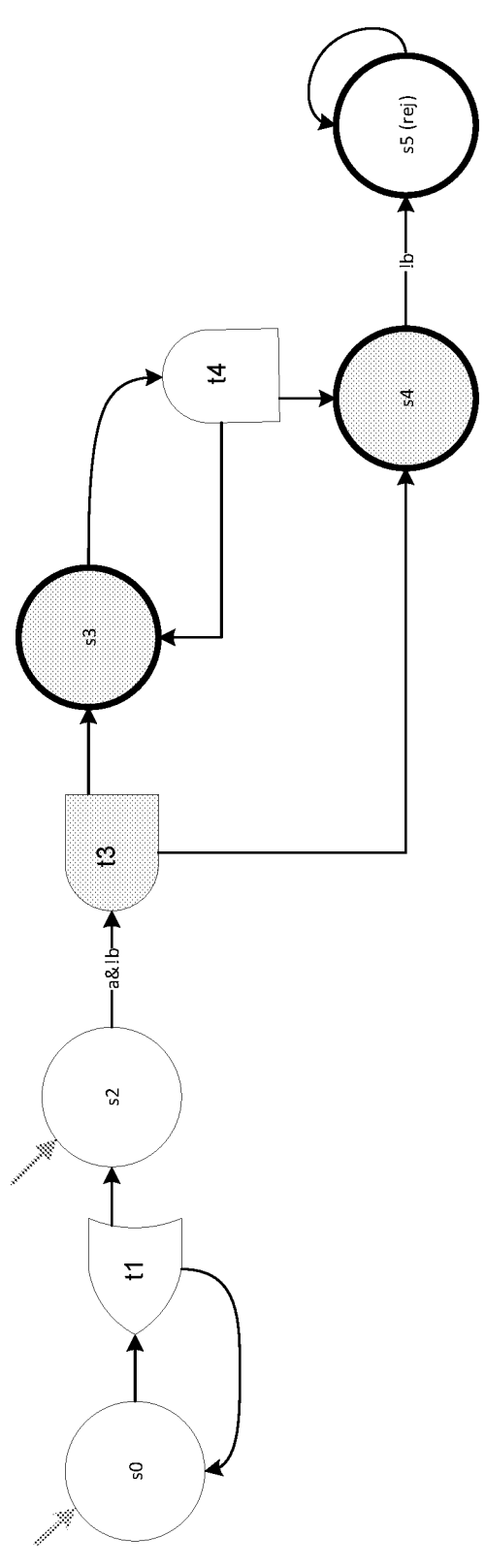
Figure 15E:
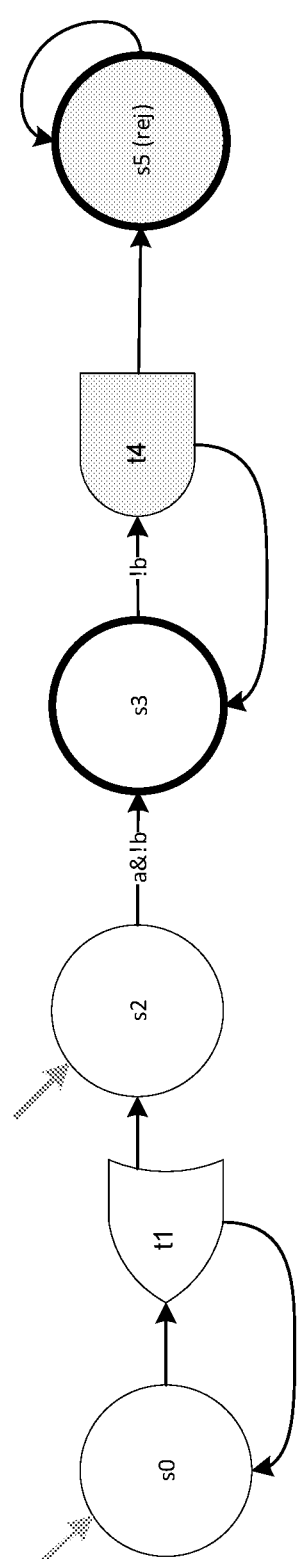
Figure 15F:
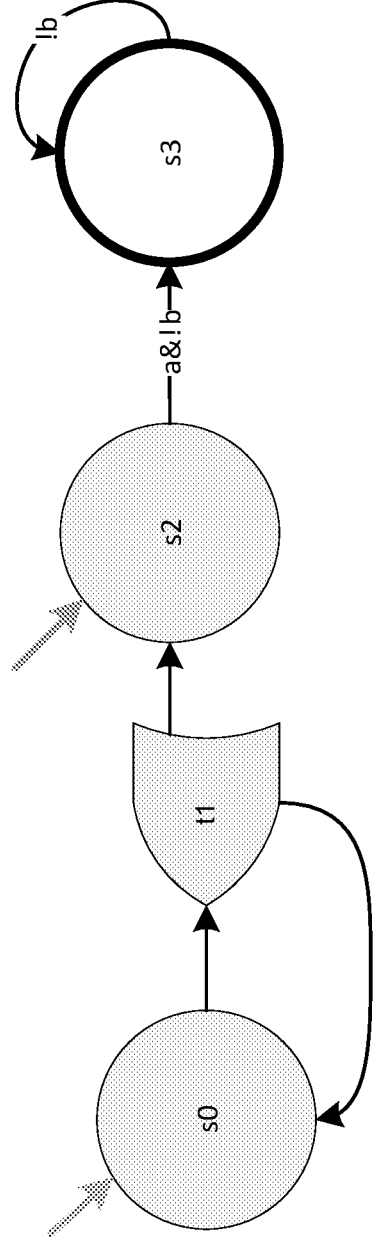
Figure 15G:
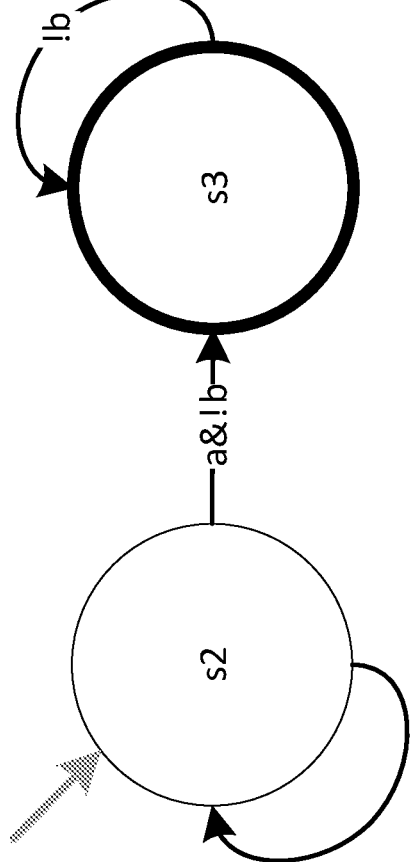

FIG. 3B shows an alternating Büchi automaton 125 that is simplified by the alternating Büchi automaton optimization component 130 to generate the simplified alternating Büchi automaton 135 shown in FIG. 3B. As shown in FIG. 3B, the simplified alternating Büchi automaton 135 has fewer states compared to the alternating Büchi automaton 125 shown in FIG. 3A even though the two alternating Büchi automata are equivalent. The reduction in number of states of the alternating Büchi automaton results in efficient execution of subsequent components that process the alternating Büchi automaton, for example, the verification component 130. The details of the steps of the process of transforming the ABW shown in FIG. 3A to the ABW shown in FIG. 3B are illustrated using FIG. 15A FIG. 15G.

Following is a definition of an alternating Büchi automaton on words (ABW). An alternating Büchi automaton is a tuple $\mathcal{A} = \langle \Sigma, S, I, \delta, F \rangle$, where $\Sigma$ is a finite alphabet, S is a set of the automaton's states, I is an initial condition, $\delta$ is a transition function, $F \subset S$ is a set of accepting states, a subset of S. Alphabet $\Sigma$ is a finite set of letters. In the context of formal verification, a letter is defined as a sequence of 0 and 1, corresponding to the values of the variables (signals) of a circuit. For example, if the circuit has two signals, a and b, then $\Sigma = \{00, 01, 10, 11\}$, where 00 corresponds to the situation when a=0, b=0, 01 corresponds to the situation when a=0, b=1, and so on. Boolean expressions on the variables correspond to subsets of the alphabet. For example, expression $a \wedge b$ (Boolean conjunction) corresponds to subset $\{11\}$, and $a \vee b$ (Boolean disjunction) corresponds to subset $\{01, 10, 11\}$.

Initial condition/is defined as a positive Boolean formula over the set of states S. A Boolean formula is called positive if it includes conjunctions and disjunctions only. For example, formulas $s_1 \wedge s_2$ and $s_1 \wedge s_2 \vee s_3$ are positive, whereas formulas containing negations, such as $A\ s_2$, are not; here $s_1, s_2, s_3 \in S$.

Transition function $\delta$ is defined as $\delta: S \times \Sigma \rightarrow \mathcal{B}^+(S)$, where $\mathcal{B}^+(S)$ is a set of positive Boolean formulas over S. The transition function maps a state and a letter into a positive Boolean formula over states.

For $Q \subset S$, Q satisfies a formula $\theta \in \mathcal{B}^+(S)$ if the truth assignment that assigns true to the members of Q and assigns false to the members of S\Q, satisfies $\theta$. For example, the sets $\{s_1, s_3\}$ and $\{s_2, s_3\}$ both satisfy the formula $(s_1 \vee s_2) \wedge s_3$, whereas the set $\{s_1, s_2\}$ does not.

The system according to an embodiment represents an ABW as a directed graph (digraph) with its transitions annotated with logical gates AND and OR. Initial states are designated with an incoming arrow, and the accepting states shown in bold (see an example in FIG. 1). If an edge is not marked with any variable, the system assumes its condition to be 1 (any letter). The outputs of AND gates are called universal transitions, and the outputs of OR gates are called existential transitions. An ABW with existential transitions only is called a nondeterministic Büchi automaton, and an ABW with universal transitions only is called a universal Büchi automaton. All optimizations applicable for ABW are also applicable for nondeterministic and universal Büchi automata as to its special cases.

A set of infinite sequences over the alphabet $\Sigma$ is designated as $\Sigma'$. A run of an automaton $\mathcal{A}$ on an infinite word $w \in \Sigma^\omega$ is a forest (set of trees), starting in the states satisfying the initial condition I, and such that the successors of a forest node n corresponding to an automaton state s satisfy $\delta(s)$.

Some of the states of the ABW may be marked as accepting states and others non-accepting states. A run is called accepting, if each its branch visits accepting states infinitely many times. Automaton $\mathcal{A}$ accepts word w if there exists an accepting run of $\mathcal{A}$ on w. The set $\mathcal{L}$ of all (infinite) words accepted by ABW $\mathcal{A}$ is called an (infinitary) language recognized by $\mathcal{A}$.

The notion of an alternating automaton may be illustrated using the example shown in FIG. 3A. Here, the alphabet $\Sigma=\{00, 01, 10, 11\}$, corresponds to two variables a and b. The automaton has eight states $S=\{s_0, \ldots, s_7\}$. Its initial condition is $s_0\lor(s_1\land s_2)$. Accordingly, any run begins either from state $s_0$ or simultaneously from states $s_1$ and $s_2$. Following are examples of transition functions. Under any alphabet letter, from state $s_0$ the transition is possible either back to $s_0$ or simultaneously to states $s_1$ and $s_2$. From $s_2$ on letters a (i.e., 10 and 11) the transition is simultaneously to states $s_3$ and $s_4$, on letters ¬a (i.e., 00 and 01) to state $s_7$. The symbol '!' is used for negation, '&' for conjunction and '|' for disjunction. States $s_3$, $s_4$ and $s_5$ are accepting, so that they must be visited in each branch of an accepting runs infinitely often.

Run $s_0, s_0, \ldots$ is not accepting on any word w because it visits only state $s_0$, and this state is not accepting. This automaton accepts words of the form $a\land\neg b, \neg b, \neg b, \ldots$. This notation, designates infinitely many words, because there exists an accepting run. This run starts at the states $s_1$ and $s_2$ and then visits only accepting states $s_3$, $s_4$ and $s_5$. The automaton does not accept any word of the form $a\land\neg b, b, \neg a, \neg a, \ldots$, because any branch of any compliant run starting from some moment will contain either only state $s_0$, or state $s_6$, or state $s_7$, all of them being nonaccepting.

The system uses a simplified ABW based on a circuit design to perform formal verification of the circuit design. Formal verification process can be described as follows. Given a model M representing a circuit design and its formal specification P, the system tries to find a behavior of M violating the formal specification P. The behavior is represented as a sequence of transitions between system states. If such a behavior can be found, the system uses the behavior as a counterexample. Otherwise, the system determines that model M implements specification P. When the specification language is LTL or RLTL, the specification defines a sequence of signal values which it accepts. For example, the SVA assertion "assert property (a|→s_eventually b)" accepts all signal value sequences such that for each occurrence of value a=1, there is a simultaneous or a future occurrence of value b=1, i.e., whenever signal a is asserted, signal b should be asserted at the same time or some time in the future.

A formal verification task may be reduced to checking that the language of the model $\mathcal{L}_m$ is a subset of the language of the specification $\mathcal{L}_s$: $\mathcal{L}_m\subset\mathcal{L}_s$. This is equivalent to checking that there is no behavior of a model violating the behavior defined by the specification, or, in terms of languages: $\mathcal{L}_m\cap\overline{\mathcal{L}_s}=\notin$, where $\overline{\mathcal{L}_s}$ is a complementation of language $\mathcal{L}_2$.

A specification is typically split into assertions and assumptions. For example, if the specification has a form of implication $$\land_{i=1}^m \psi_i \rightarrow \land_{j=1}^n \phi_j,$$

it is split into assumptions $\psi_i$, i=1, . . . , m and assertions $\phi_j$, j=1, . . . , n. Here, $\phi$ and $\psi$ are temporal formulas, for example, formulas specified using LTL (Linear Temporal Logic) or RLTL (Regular Linear-time Temporal Logic). This implication may be rewritten as $$\neg \land_{i=1}^m \psi_i \lor \land_{j=1}^n \phi_j.$$

Figure 4:
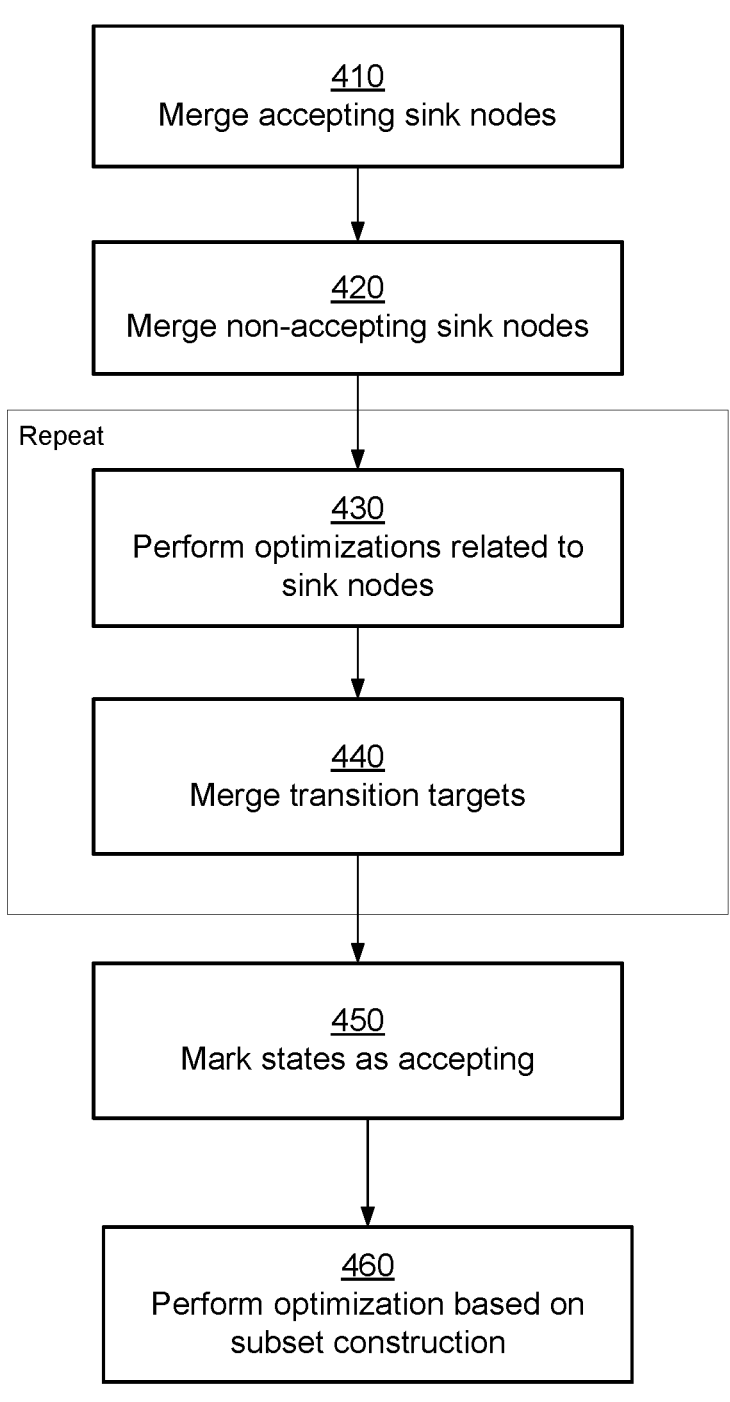
FIG. 4 shows a flowchart illustrating a process for simplifying an ABW, according to an embodiment.

FIG. 4 shows a flowchart illustrating a process 400 for simplifying an ABW, according to an embodiment. In step 410, the system merges together accepting sink nodes. The details of these steps are described in the flowcharts illustrated in FIG. 5 and FIG. 7 and illustrated via examples in FIG. 6A-B and FIG. 8A-B. In step 420, the system merges together non-accepting sink nodes. The system repeats the steps 430 and 440 for each sink node. In step 430, the system performs optimizations related to sink nodes, as described herein. In step 440, the system merges transition targets, as described herein. In step 450, the system marks states as accepting where possible, as described herein. Marking more steps as accepting improves the efficiency of execution of certain formal verification techniques. The system may also turn accepting states into non-accepting, if necessary, for example, if required by certain optimizations. In step 460, the system performs an optimization called subset construction as described herein.

Figure 5:
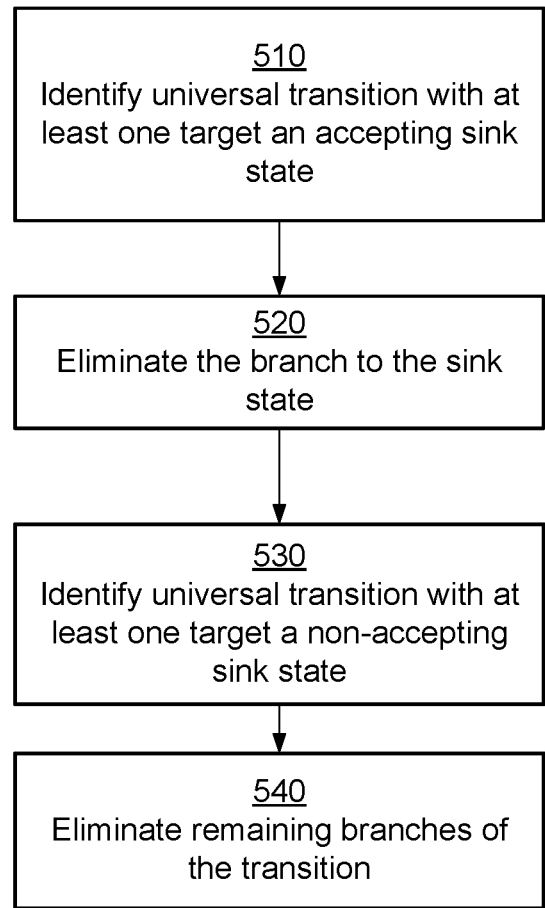
FIG. 5 shows a flowchart illustrating the process of merging sink nodes according to an embodiment.
Figure 7:
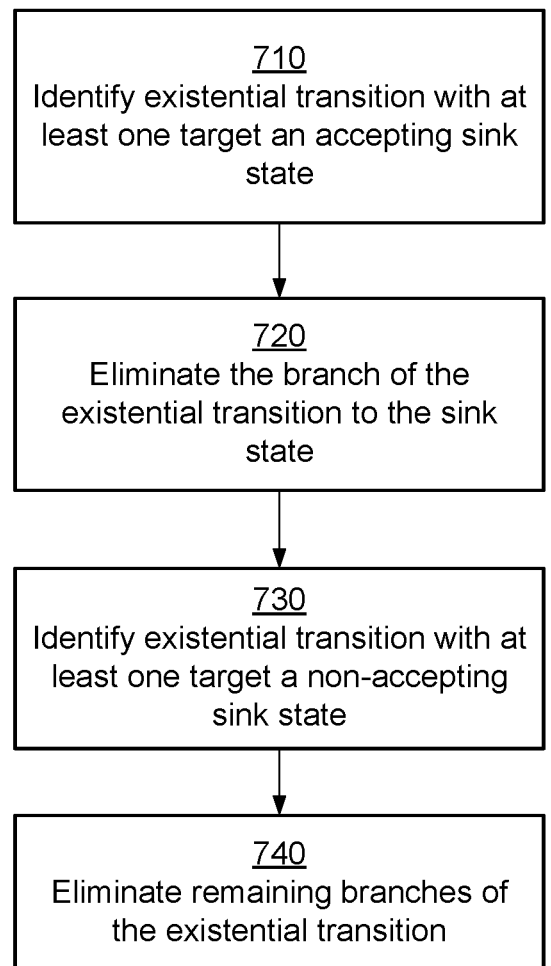
FIG. 7 shows a flowchart illustrating the process of merging sink nodes according to another embodiment.

The processes illustrated in FIGS. 5 and 7 illustrates details of the step 410 of the flowchart shown in FIG. 4. FIG. 5 shows a flowchart illustrating the process of merging sink nodes according to an embodiment. If there is a universal transition with one of its targets being an accepting sink state, the system eliminates the transition to this sink state. If one of the targets of a universal transition is a non-accepting sink state, all other branches of this transition are eliminated.

In step 510, the system identifies a universal transition with at least one target accepting sink state. In step 520, the system eliminates the branch to the accepting sink state. In step 530, the system identifies a universal transition with at least one target non-accepting sink state. In step 540, the system eliminates the remaining branches of the transition, i.e., branches other than the branch to the non-accepting sink state.

Figure 6A:
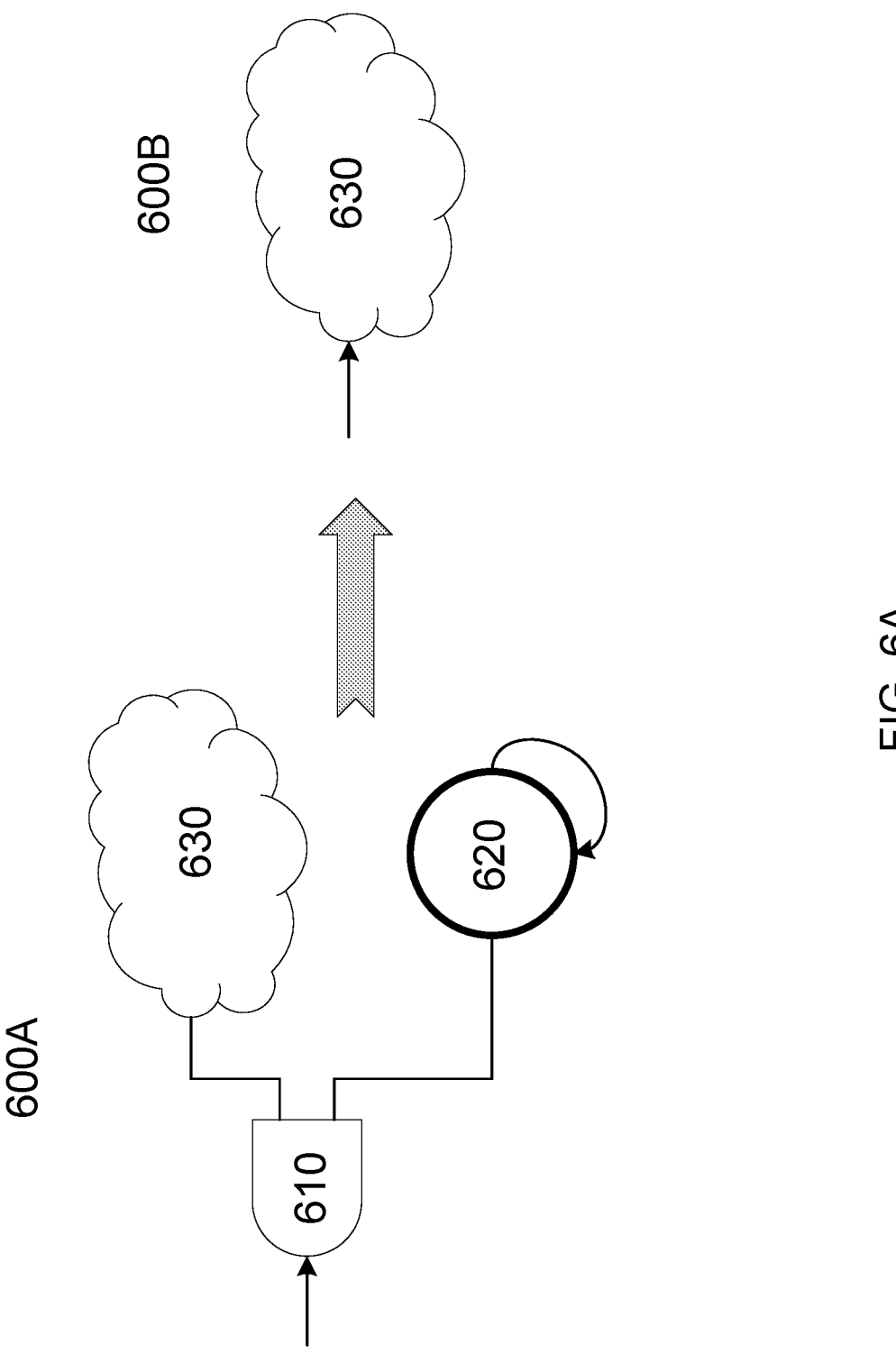
FIGS. 6A-B shows example ABWs simplified using the process illustrated in FIG. 5 according to an embodiment.
Figure 6B:
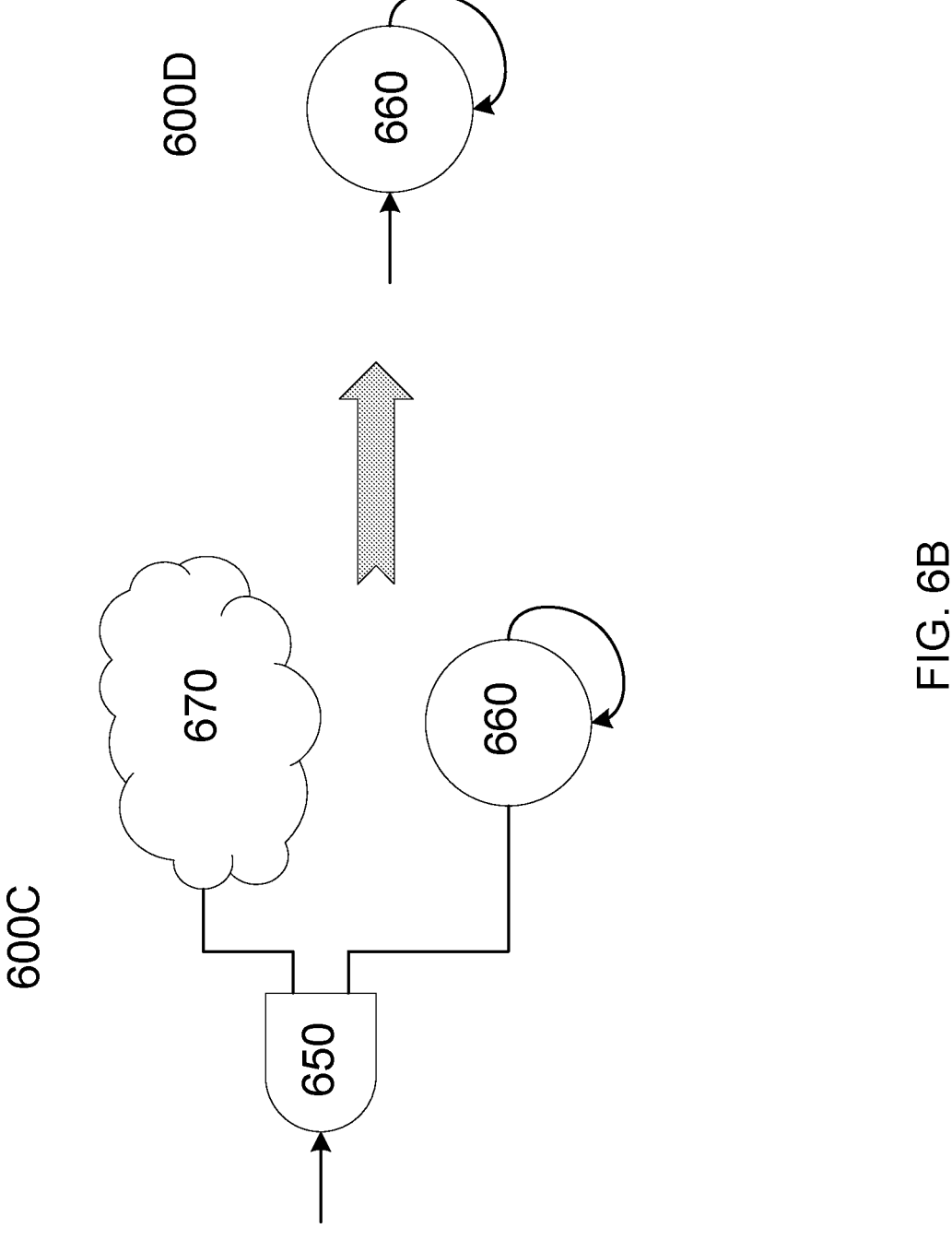

FIGS. 6A-B shows an example of ABWs simplified using the process illustrated in FIG. 5 according to an embodiment. A circle icon, e.g., 620 in a state transition diagram refers to a state while a cloud icon e.g., 630 refers to a portion of the state transition diagram that may include one or more states and state transitions. FIG. 6A shows an ABW 600A with a universal transition 610 that has one target accepting state 620 and other transitions 630. The system eliminates the branch to accepting state 620 to obtain the simplified ABW 600B. FIG. 6B shows an ABW 600C with a universal transition 650 that has one target non-accepting state 660 and other transitions 670. The system eliminates the remaining branches 670 to obtain the simplified ABW 600D.

FIG. 7 shows a flowchart illustrating the process of merging sink nodes according to another embodiment. The system eliminates existential transitions to a non-accepting sink state. If one target of an existential transition is an accepting sink state, the system eliminates the remaining branches of this transition. In step 710, the system identifies an existential transition with at last one target non-accepting sink state. In step 720, the system eliminates the branch to the non-accepting sink state. In step 730, the system identifies an existential transition with at least one target accepting sink state. In step 740, the system eliminates the remaining branches of the transition, i.e., branches other than the branch to the accepting sink state.

Figure 8A:
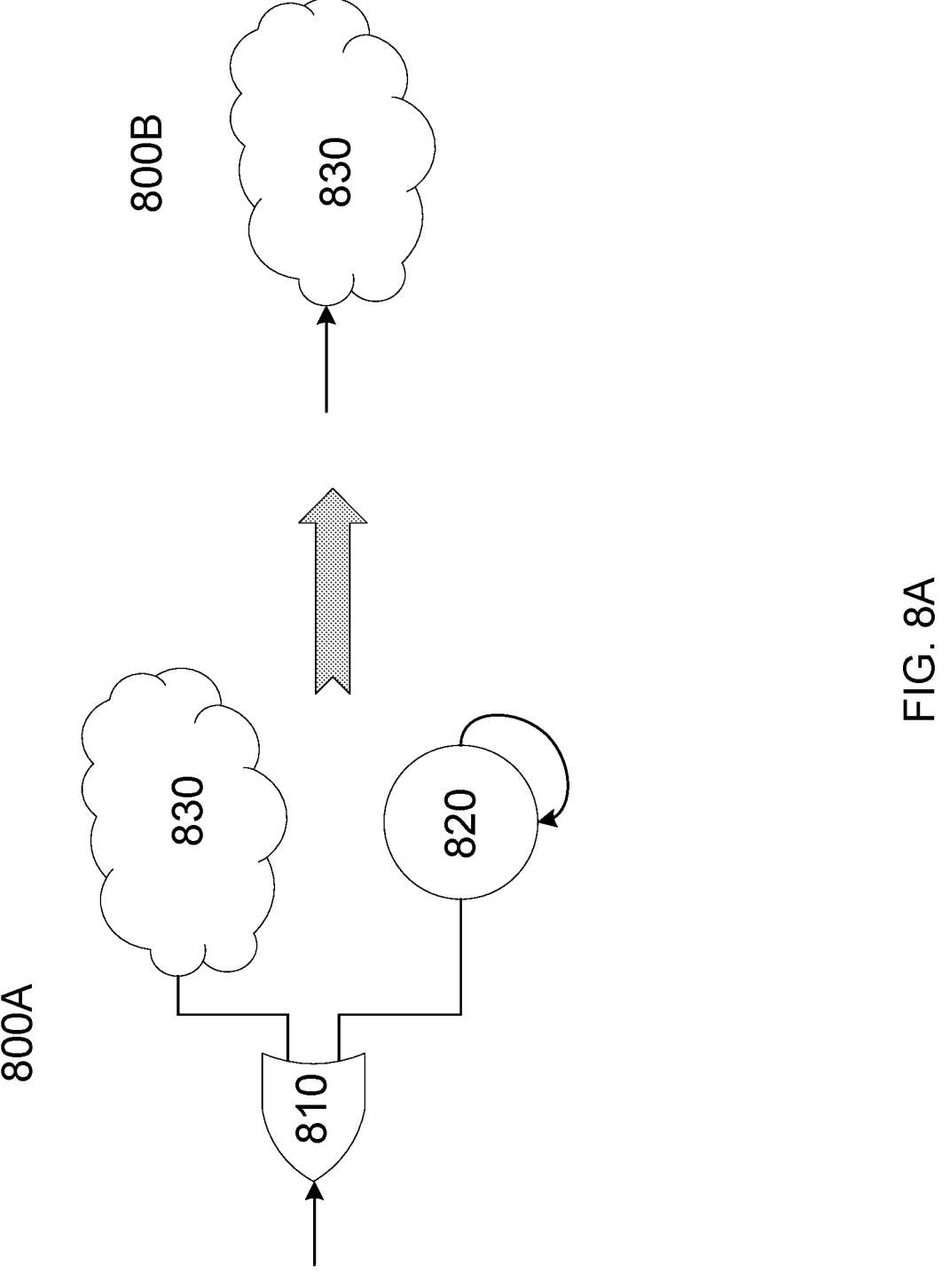
FIGS. 8A-B shows example ABWs simplified using the process illustrated in FIG. 7 according to an embodiment.
Figure 8B:
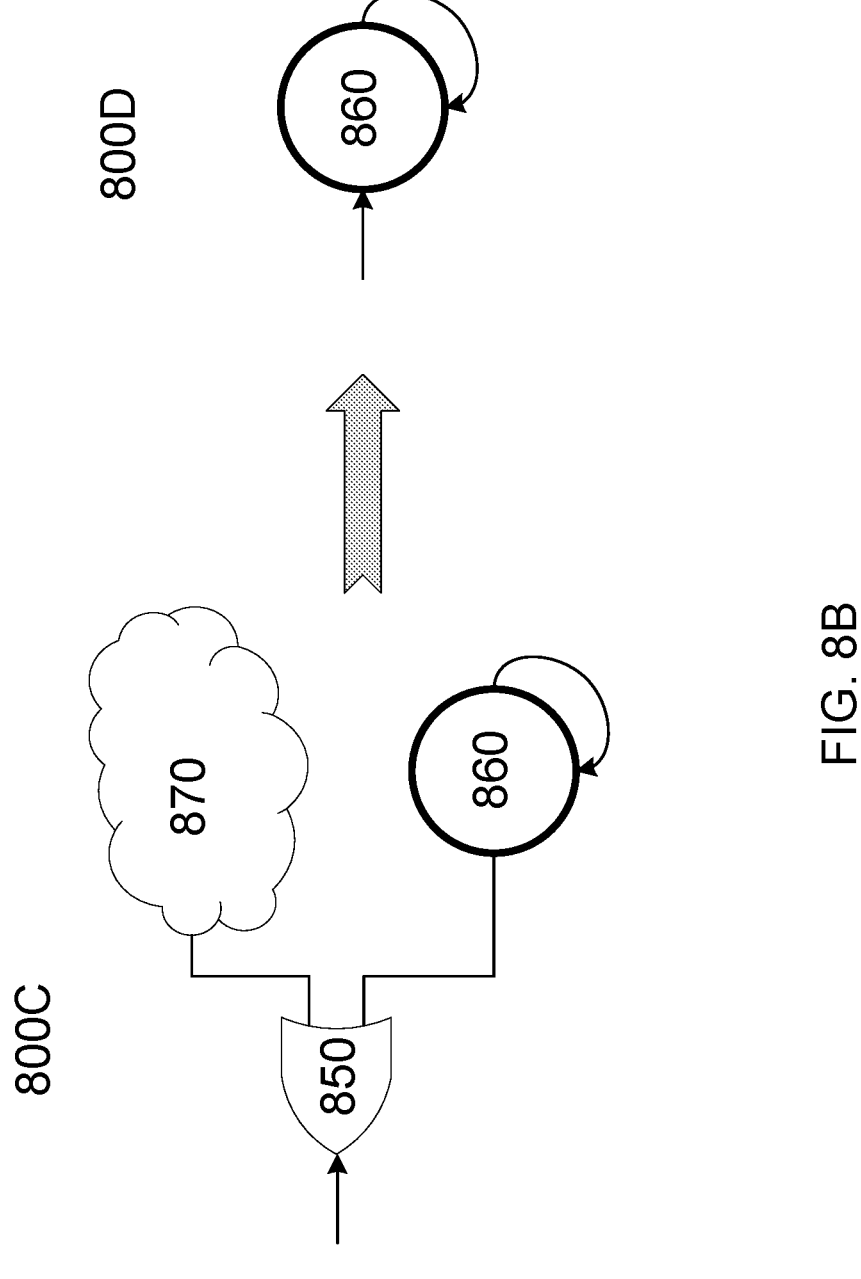

FIGS. 8A-B shows example ABWs simplified using the process illustrated in FIG. 7 according to an embodiment. FIG. 8A shows an ABW 800A with an existential transition 810 that has one target a non-accepting state 820 and other transitions 830. The system eliminates the branch to the non-accepting state 820 to obtain the simplified ABW 800B. FIG. 8B shows an ABW 800C with an existential transition 850 that has one target accepting state 860 and other transitions 870. The system eliminates the remaining branches 870 to obtain the simplified ABW 800D.

Figure 9:
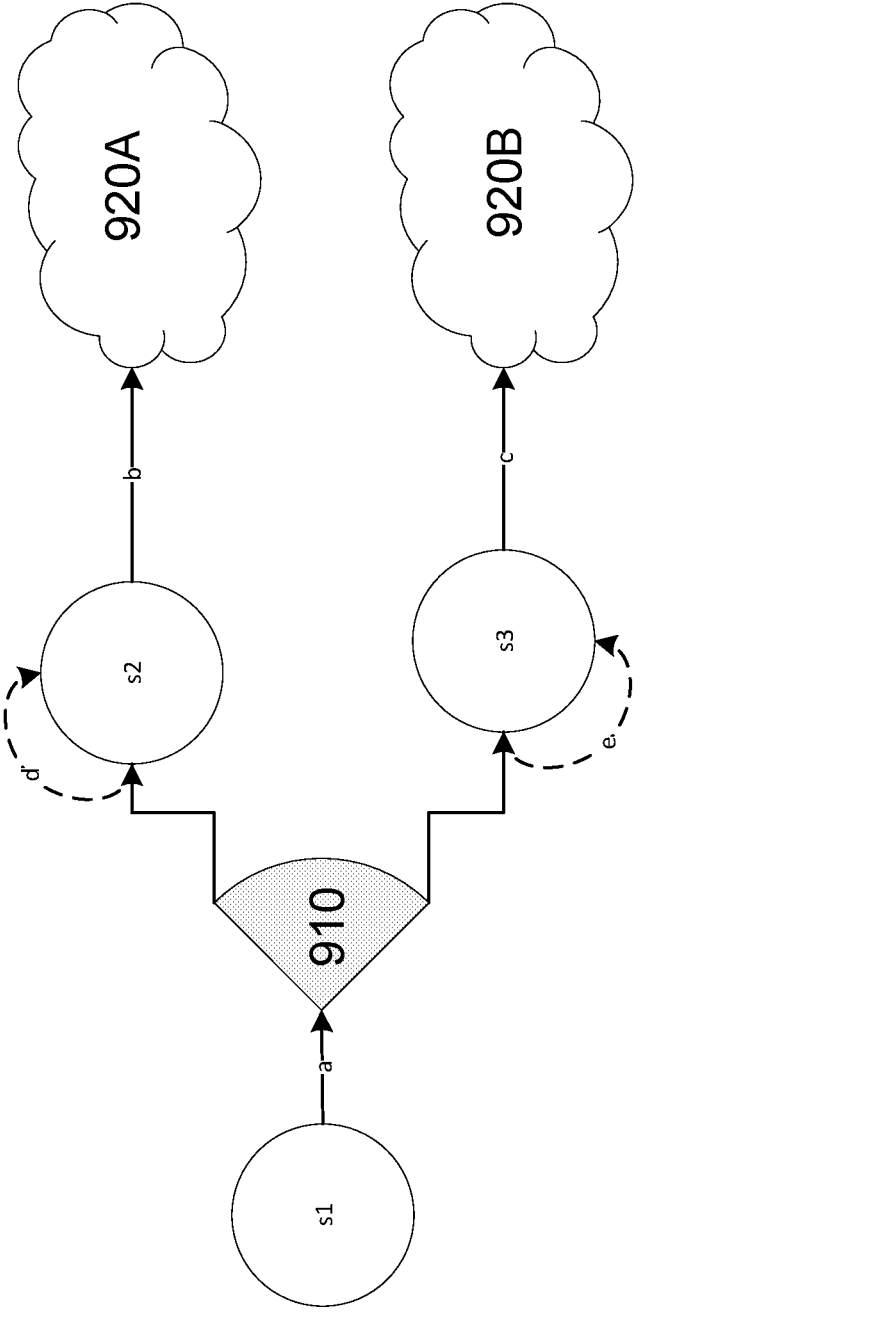
FIG. 9 illustrates step 440 of the process illustrated in FIG. 4 that performs merging of transition targets, according to an embodiment.

FIG. 9 illustrates step 440 of the process illustrated in FIG. 4 that performs merging of transition targets, according to an embodiment. The transition 910 in FIG. 9 signifies either an OR or an AND transition. The cloud icons 920A, 920B, 940 refer to a portion of the state transition diagram that may include one or more states and state transitions. The system merges states $s_2$ and $s_3$ together to reduce the number of the automaton's states.

According to an embodiment, the system merges similar states. The system determines two states to be similar if they have the same accepting condition, i.e., either both states are accepting or both states are non-accepting and they have identical transitions (i.e., same transition function and the same targets.) The system may merge similar states into one state. Namely, if $s_1$ and $s_2$ are similar states, then the system may completely eliminate $s_2$ and replace $s_2$ with $s_1$ in all transition functions and initial conditions.

Figure 10:
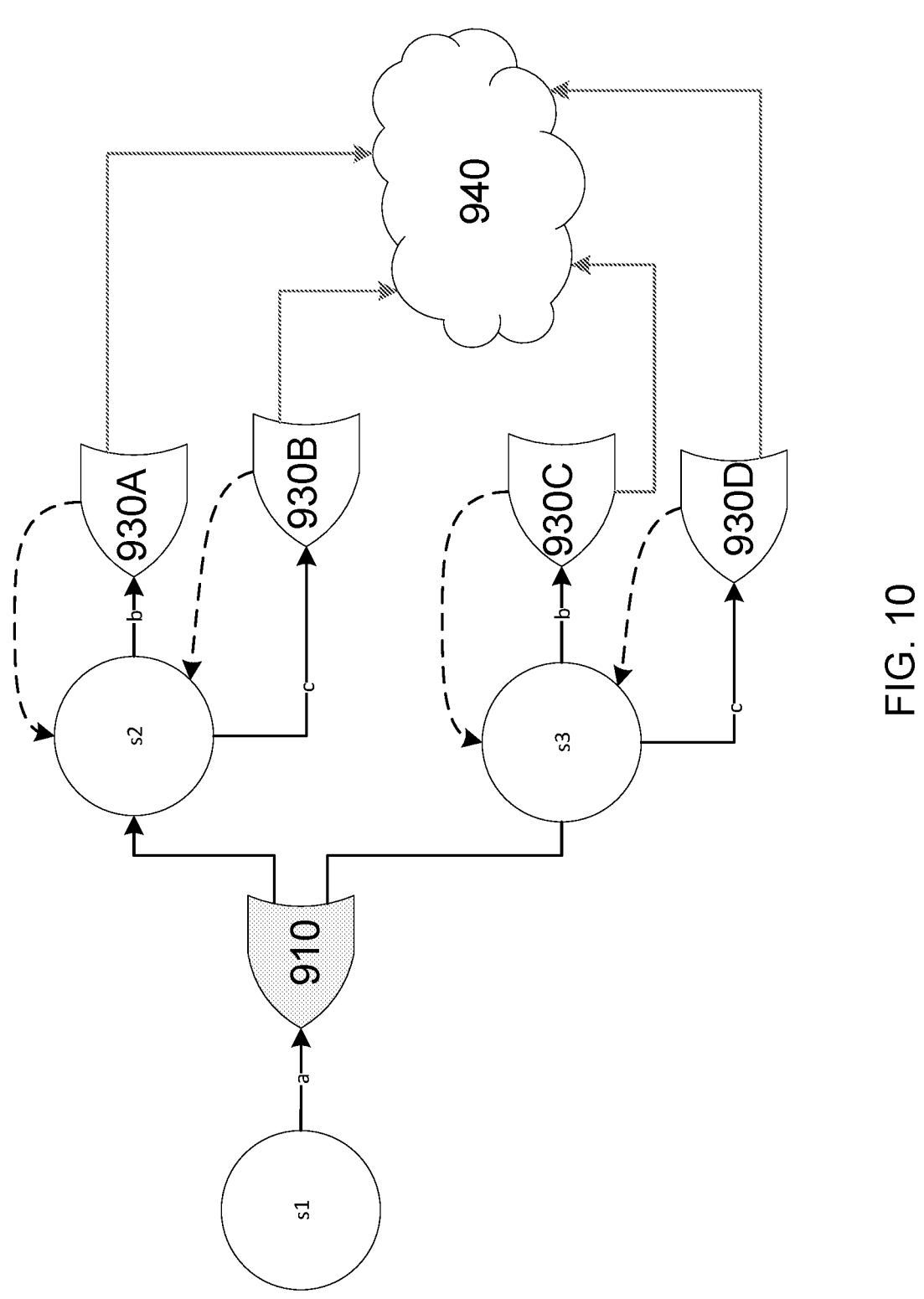
FIG. 10 illustrates an example illustrating the step 440 of the process shown in FIG. 4, according to an embodiment.
Figure 11:
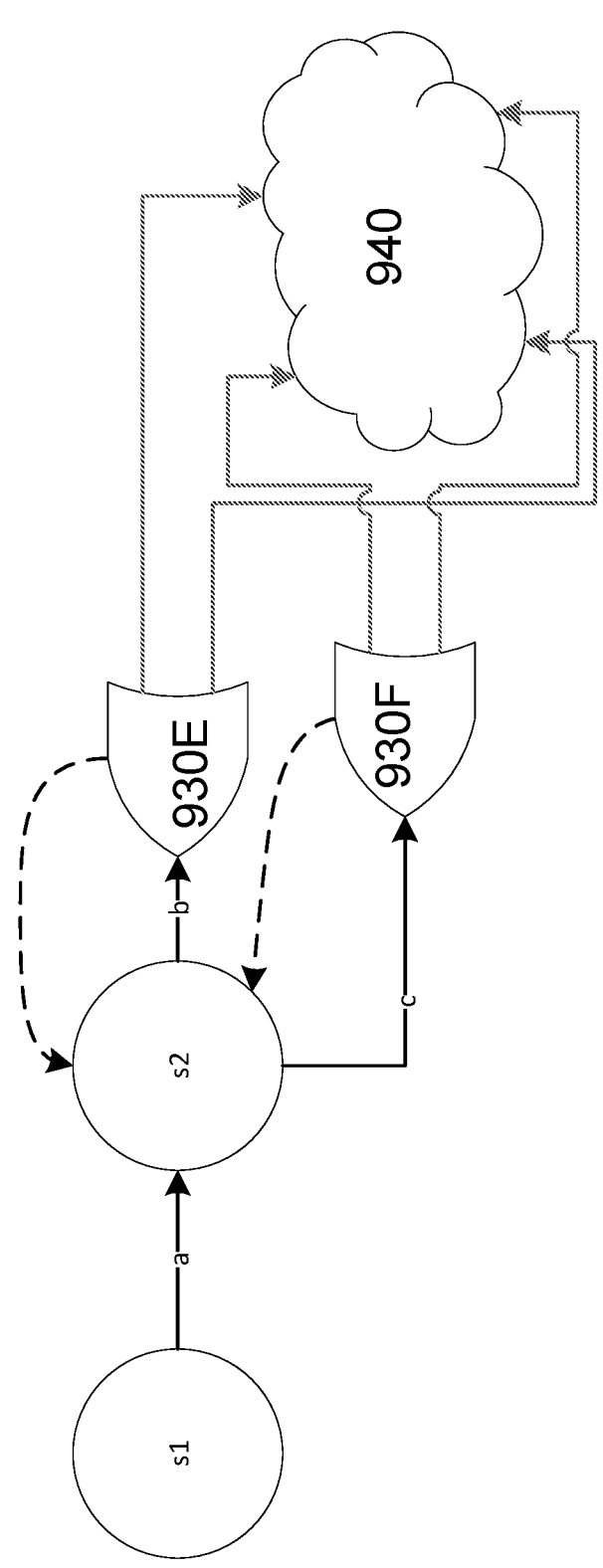
FIG. 11 illustrates the result of merging transitions for the example ABW of FIG. 10, according to an embodiment.

FIG. 10 illustrates an example illustrating the step 440 of the process shown in FIG. 4, according to an embodiment. FIG. 11 illustrates the result of merging transitions for the example ABW of FIG. 10, according to an embodiment.

In the configuration shown in FIG. 10, states $s_2$ and $s_3$ should be either directly reached only from state $s_1$, or $s_2$ and $s_3$ both should have self-loops. Transitions from states $s_2$ and $s_3$ e.g., transitions 930A, 930B from states $s_2$ or transitions 930C and 930D from state $s_3$ should be existential and have the same respective conditions (such as b and c in FIG. 10). Each of these transitions may have an arbitrary number of targets: one or more. The cloud 940 may include any number of automaton states, excluding $s_2$ and $s_3$ states. The states $s_2$ and $s_3$ are either both initial or both non-initial. If they are both initial, the initial condition including them is disjunctive, e.g., $s_2 \lor s_3$.

Similarly, the system processes the cases when the outgoing transition from state $s_1$ has any number of targets with the same outgoing conditions and when there is an arbitrary number of outgoing transitions from states $s_2$, $s_3$, . . . .

The case when the outgoing conditions in states $s_2$ and $s_3$ are different, is reduced as follows. If state $s_2$ has an outgoing condition $\alpha$ and state $s_3$ has an outgoing condition $\beta$, $\beta \neq \alpha$, the system splits these conditions into $\alpha \land \overline{\beta}$, $\alpha \land \beta$ and $\overline{\alpha} \land \beta$ (and similarly for any number of conditions).

The described transformation is valid when states $s_2$ and $s_3$ have the same acceptance condition. The automaton obtained by merging the transitions according to steps 440 is shown in FIG. 11. The transformation is invalid when only one state s1 has a self-loop and there is no transition from s1 to s2.

The system processes the universal transition similar to the existential transitions when the disjunctions are replaced with conjunctions. For each pair $\alpha$ and $\beta$ of the outgoing conditions of states $s_2$ and $s_3$ (as shown in FIG. 10 where the existential transition is replaced with the universal one) the resulting condition is $\alpha \land \beta$.

According to various embodiments, the system merges states $s_2$ and $s_3$ with the necessary modifications if they have the same acceptance condition.

Figure 12A:
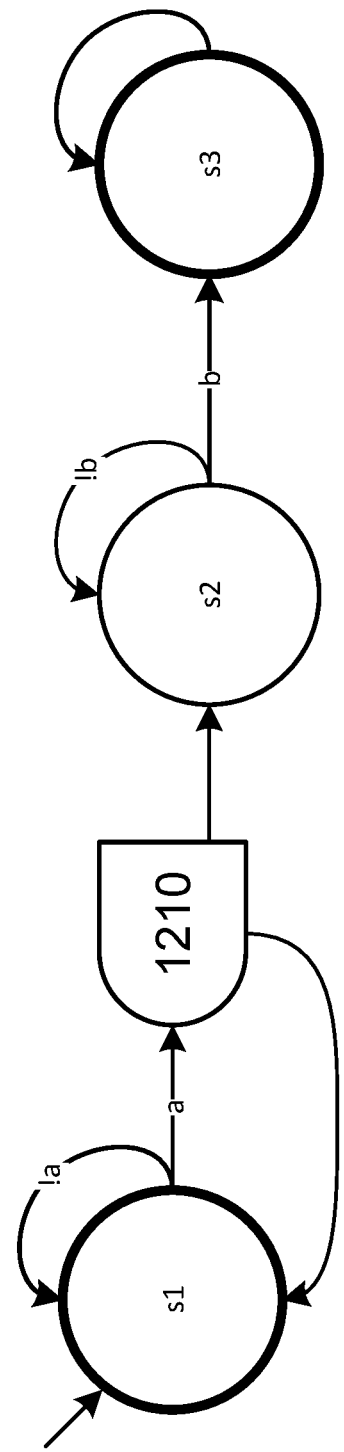
FIGS. 12A-B illustrate the step of subset construction for simplifying an ABW according to an embodiment.
Figure 12B:
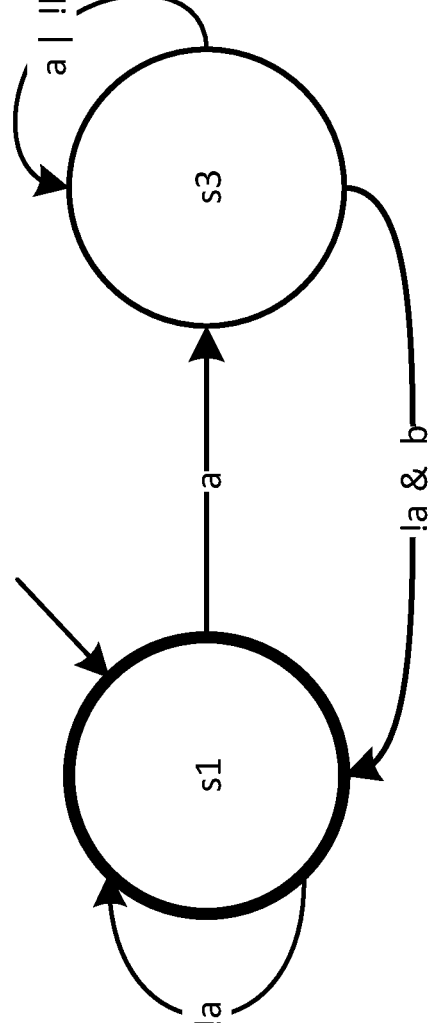

FIGS. 12A-B illustrate the step of subset construction for simplifying an ABW according to an embodiment. The system applies subset construction techniques to reduce of an ABW to a an NBW (nondeterministic Büchi automaton on words). The automaton shown in FIG. 12A may be replaced with the automaton shown in FIG. 12B when a and b are mutually exclusive (i.e., when $a \land b = false$). This optimization eliminates one automaton state $s_2$ and the transition 1210.

Acceptance condition of some state may be immaterial. Accordingly, the ABW accepts the same language independent of whether these states are accepting or not. Typically accepting states are handled more efficiently by formal verification tools, but in certain situations it is desired that a specific state to be non-accepting, for example, for the applicability of some state reduction optimizations described below. For example, the system may convert an accepting state to a non-accepting state if required by certain transformations tat simplify the ABW. Following is a discussion of conditions for turning an accepting state to a non-accepting or vice versa.

Figure 13:
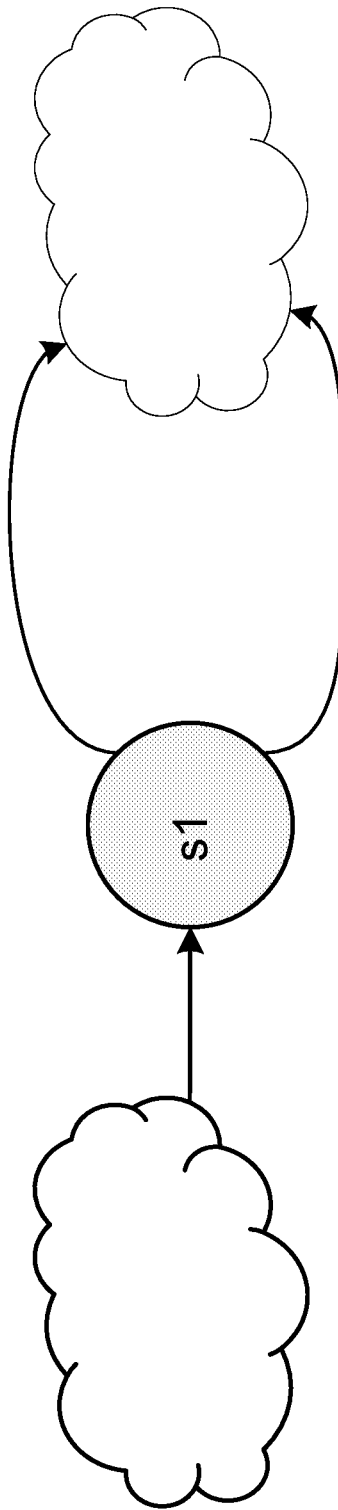
FIG. 13 illustrates an example state transition diagram illustrating situations when a state may be made accepting as mentioned in step 450 of FIG. 4, according to an embodiment.

FIG. 13 illustrates an example state transition diagram illustrating situations when a state may be made accepting as mentioned in step 450 of FIG. 4, according to an embodiment. The system may change the acceptance state of certain states from non-accepting to accepting or vice versa as stated in step 450 of FIG. 4.

The automaton graph is a digraph, and it may be partitioned into maximal strongly connected components (MSCC). An MSCC is considered a feedthrough if it has a single state with no self-loops, for example, state s1 as shown in FIG. 13. The system may assign the acceptance of a feedthrough state arbitrarily. This is because a feedthrough state may be visited only finitely many times (namely, at most once) in any branch of an automaton's run. A run may visit a feedthrough state infinitely many times, but different occurrences of this state would belong to different branches. If there is no specific reason to mark a feedthrough state as non-accepting, the system makes the feedthrough state as an accepting state.

Figure 14:
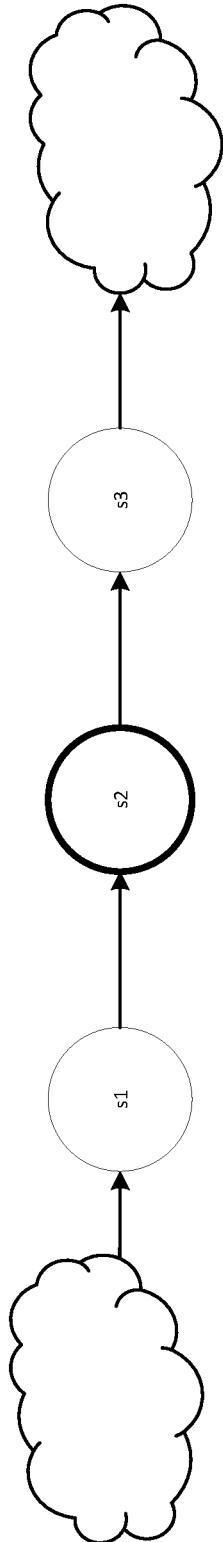
FIG. 14 is a graph with a chain of states illustrating an example of changing a state from non-accepting to accepting state as mentioned in step 450 of FIG. 4, according to an embodiment.

FIG. 14 is a graph with a chain of states illustrating an example of changing a state from non-accepting to accepting state as mentioned in step 450 of FIG. 4, according to an embodiment. If an ABW fragment is a directed acyclic graph (DAG), such that all the edges connecting internal states of this DAG belong to the DAG, and there is a DAG cut from accepting states only, all the states of this DAC may be made accepting. For example, FIG. 14 shows an example graph with a chain of states that passes through state $s_2$ which is an accepting state. Since state $s_2$ is accepting, states $s_1$ and $s_3$ may also be made accepting.

The application of the process of FIG. 4 is illustrated using examples in FIGS. 15A-G and FIGS. 16A-H. FIGS. 15A-G illustrate simplifications performed to an ABW based on the process illustrated in FIG. 4 according to an embodiment. In FIGS. 15A-G, the portion of the automaton (e.g., states or transitions) which is the subject of the specific optimization illustrated in that figure is shown as shaded (or highlighted).

The ABW shown in FIG. 15 corresponds to the assertion "assert property (a|→s_eventually b)" and is equivalent to the ABW shown in FIG. 3A. FIG. 15A shows the ABW of FIG. 3A, while omitting the non-accepting sink states. FIG. 15B shows the result of merging two states $s_1$ and $s_2$ and elimination of a universal transition $t_2$. Accordingly, targets $s_1$ and $s_2$ of the same universal transition $t_2$ are merged producing the ABW shown in FIG. 15B. FIG. 15C shows the result of elimination of a universal transition. The system performs simplifications according to step 430 of FIG. 4 and eliminates the universal transition to state $s_5$, as shown in FIG. 15C. FIG. 15D shows that state $s_4$ is made accepting. FIG. 15E shows the result of merging targets $s_3$ and $s_4$ of universal transition $t_4$. In the resulting ABW the accepting sink state $s_5$ is eliminated by applying the optimization from step 440 to obtain the ABW shown in FIG. 15F. The system merges targets $s_0$ and $s_2$ of the existential transition $t_1$ to get the ABW shown in FIG. 15G. The system may restore a non-accepting sink state to generate the ABW shown in FIG. 3B.

Figure 16A:
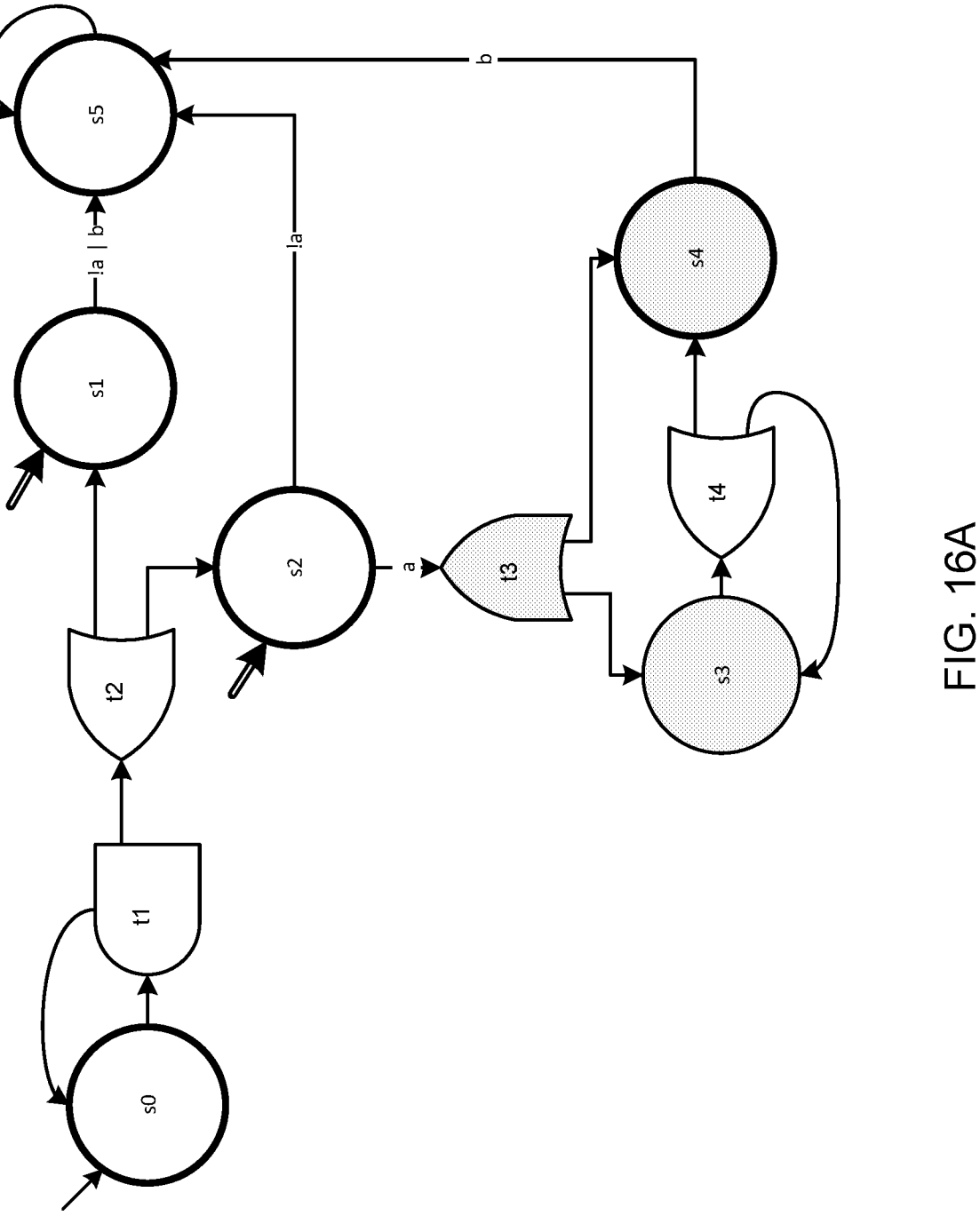
FIGS. 16A-16H illustrate simplifications performed to another example ABW based on the process shown in FIG. 4 according to an embodiment.
Figure 16B:
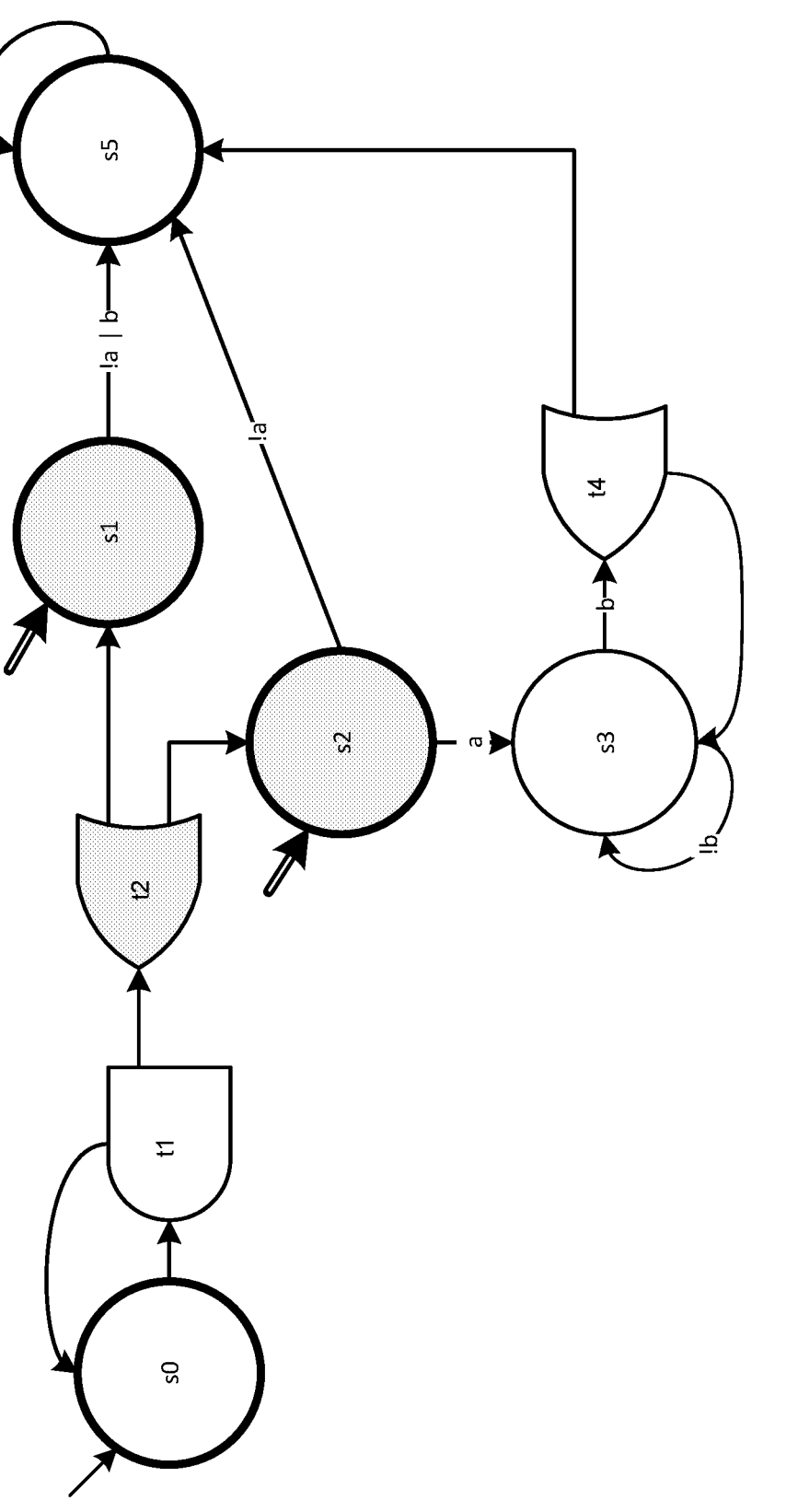

FIGS. 16A-H illustrate simplifications performed to another example ABW based on the process shown in FIG. 4 according to an embodiment. FIG. 16A shows an ABW based on the assertion "assume property (a|→s_eventually b)". The initial condition for the ABW shown in FIG. 16A initial condition is $s_0/\backslash(s_1\backslash/s_2)$.

Figure 16C:
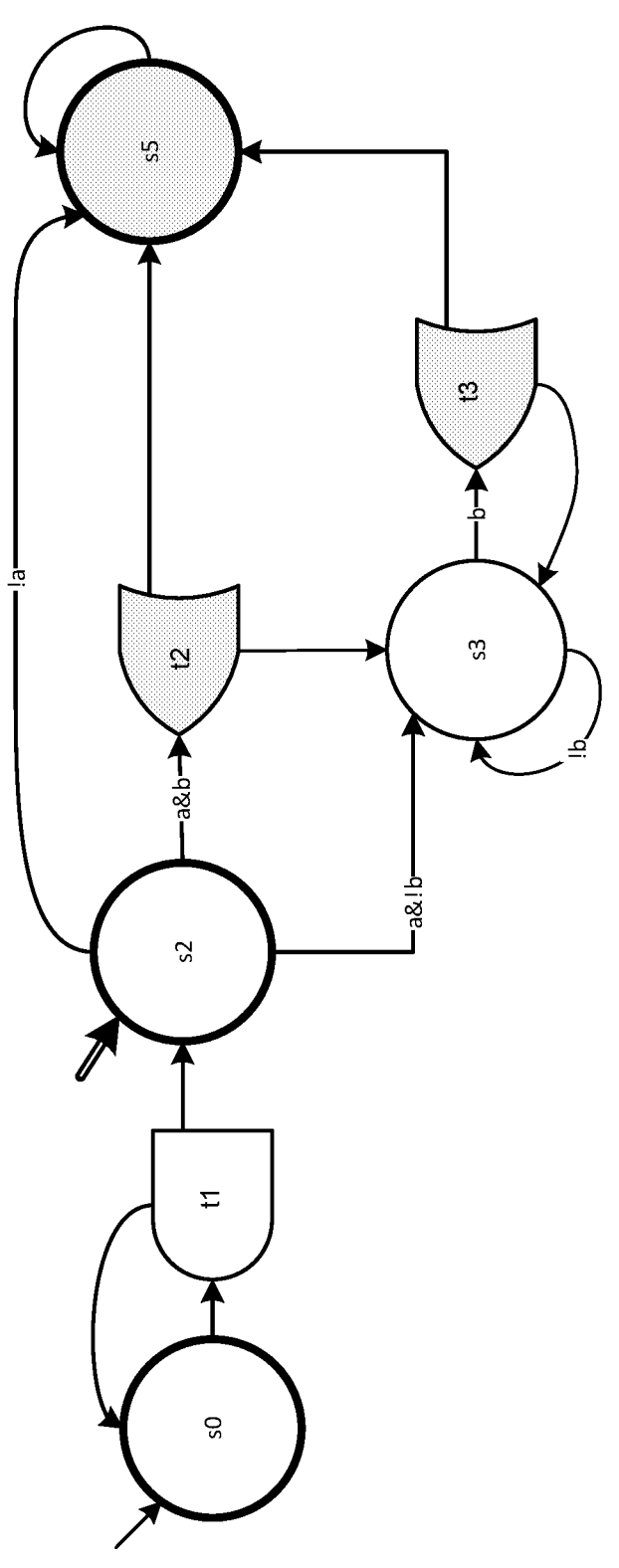
Figure 16D:
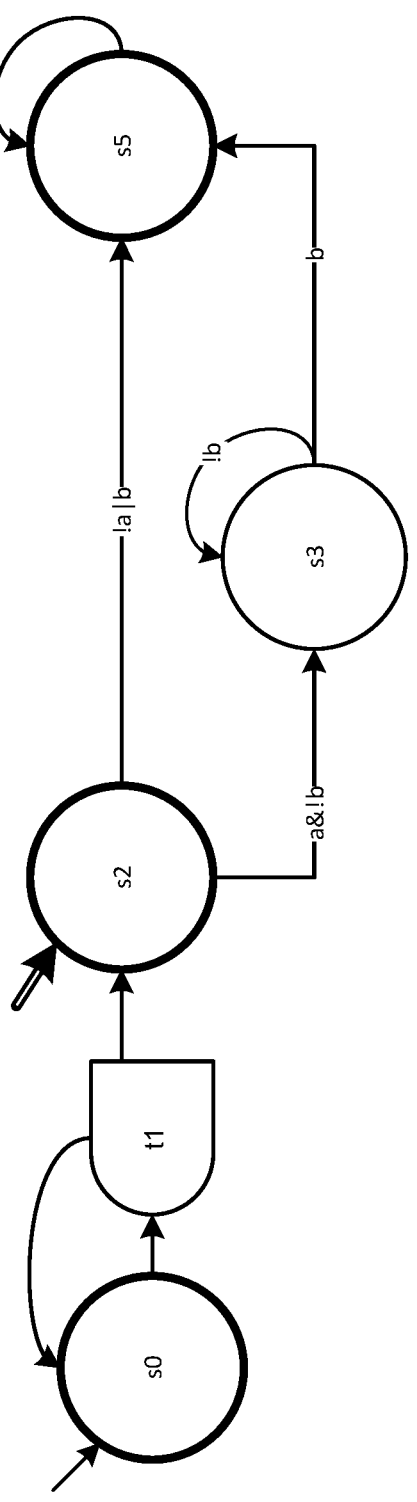
Figure 16E:
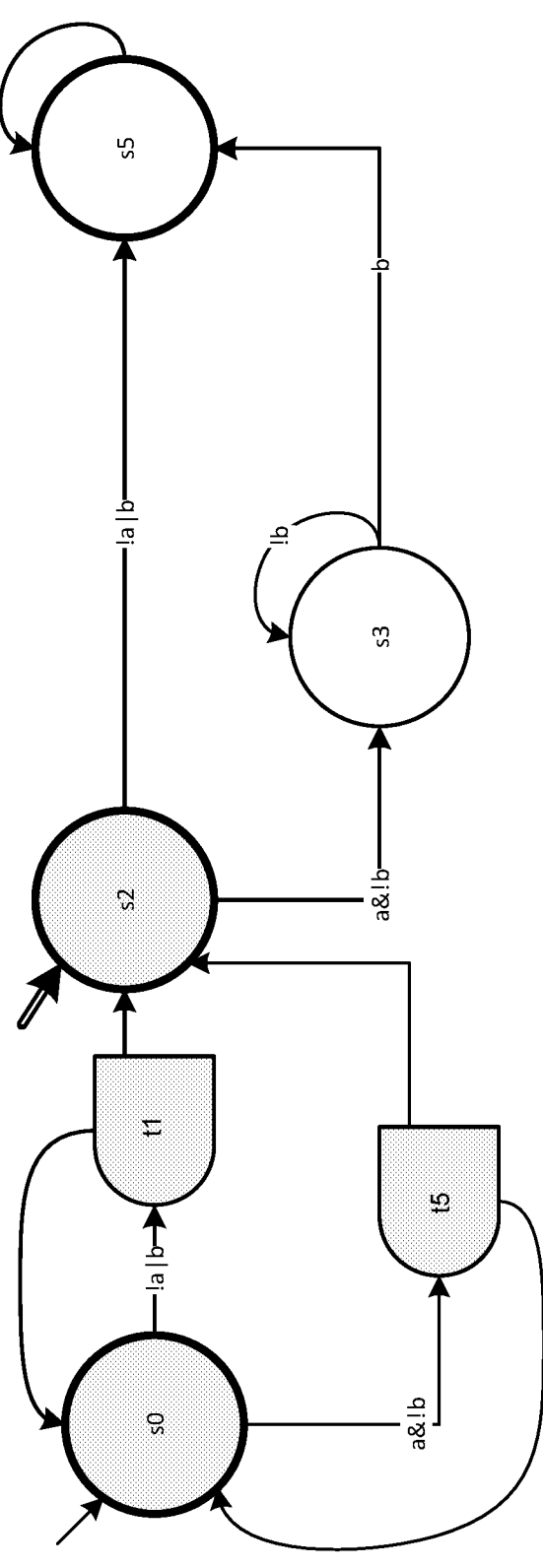
Figure 16F:
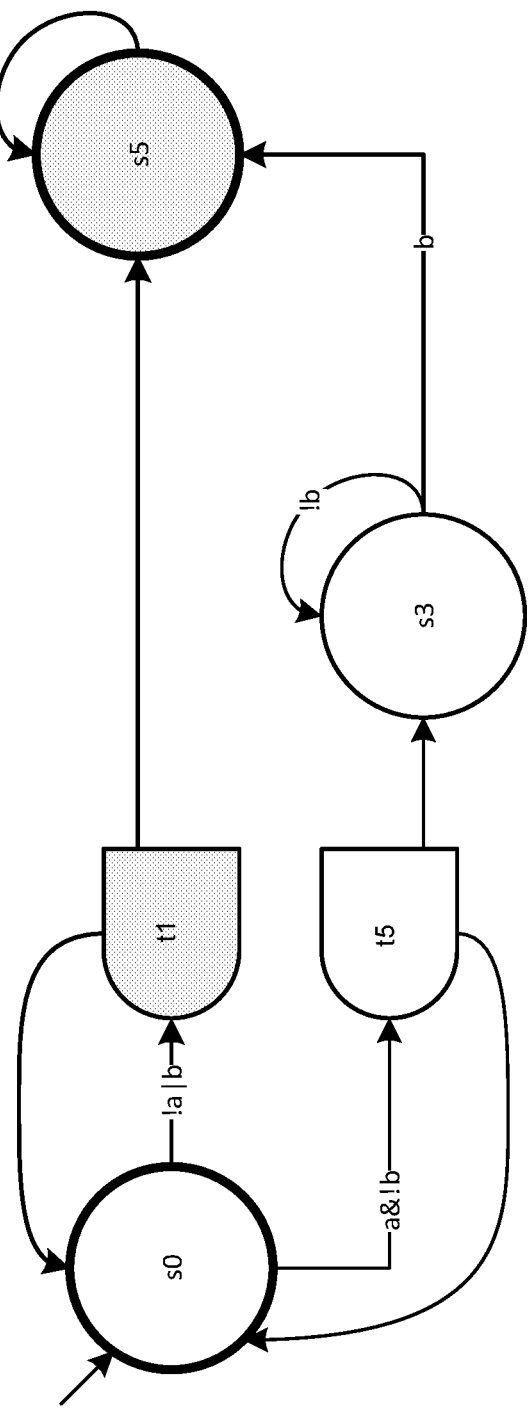
Figure 16G:
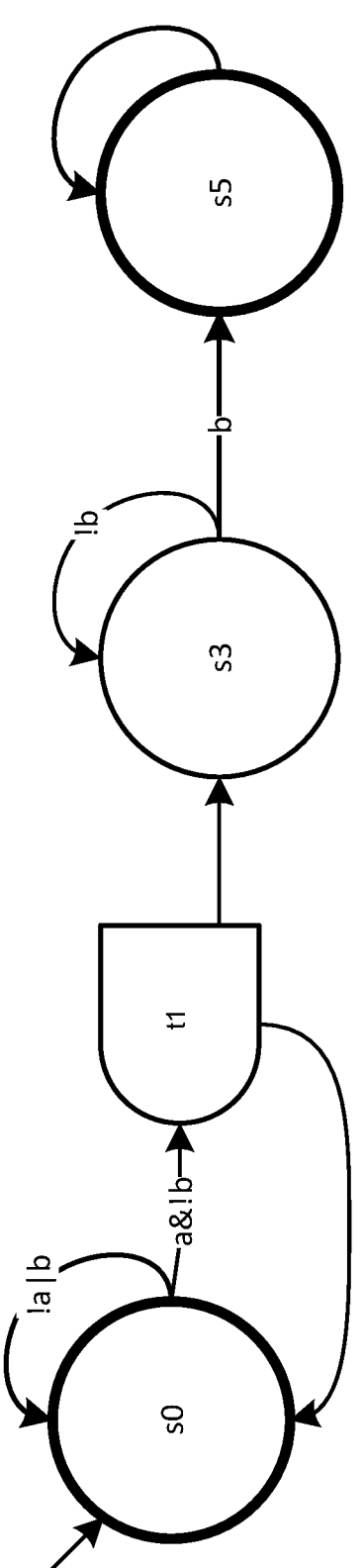
Figure 16H:
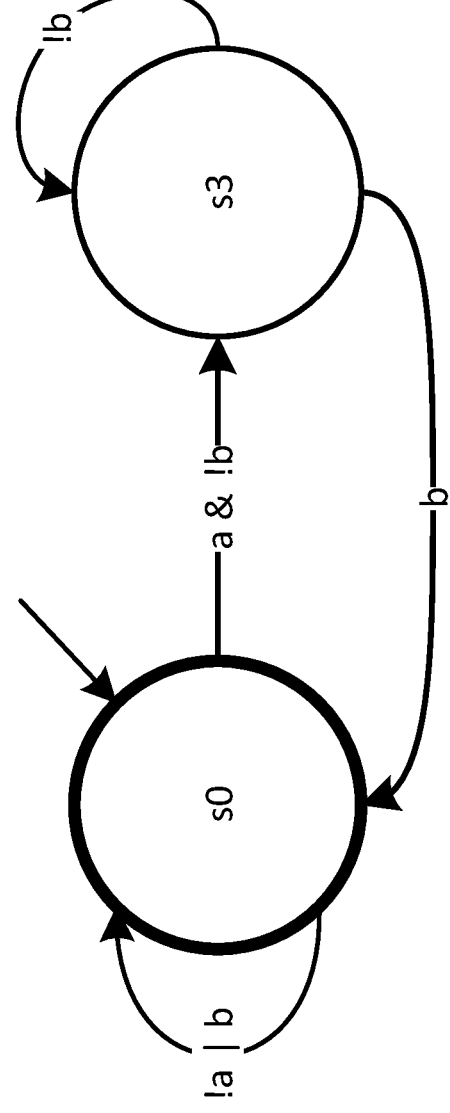

FIG. 16C shows the result of merging of states $s_3$ and $s_4$ of the existential transition t3 by applying step 430 of the process shown in FIG. 4. FIG. 16C shows the result of merging of states $s_1$ and $s_2$. FIG. 16D shows the result of eliminating existential transitions t2 and t3 by repeatedly applying step 430 of the process shown in FIG. 4. States $s_0$ and $s_2$ shown in FIG. 16D cannot be merged directly because their outgoing relation labeling is different. First, the outgoing relation of $s_0$ is split to match the outgoing relations of $s_2$, as shown in FIG. 16E. FIG. 16F shows merging of universal transition targets $s_0$ and $s_2$ shown in FIG. 16E by introducing the universal transition t5. FIG. 16F illustrates merging of states $s_0$ and $s_2$ by applying step 430 of the process shown in FIG. 4. FIG. 16G shows elimination of a universal transition t5. FIG. 16H shows the final optimized ABW by applying step 460 of the process shown in FIG. 4.

Figure 17:
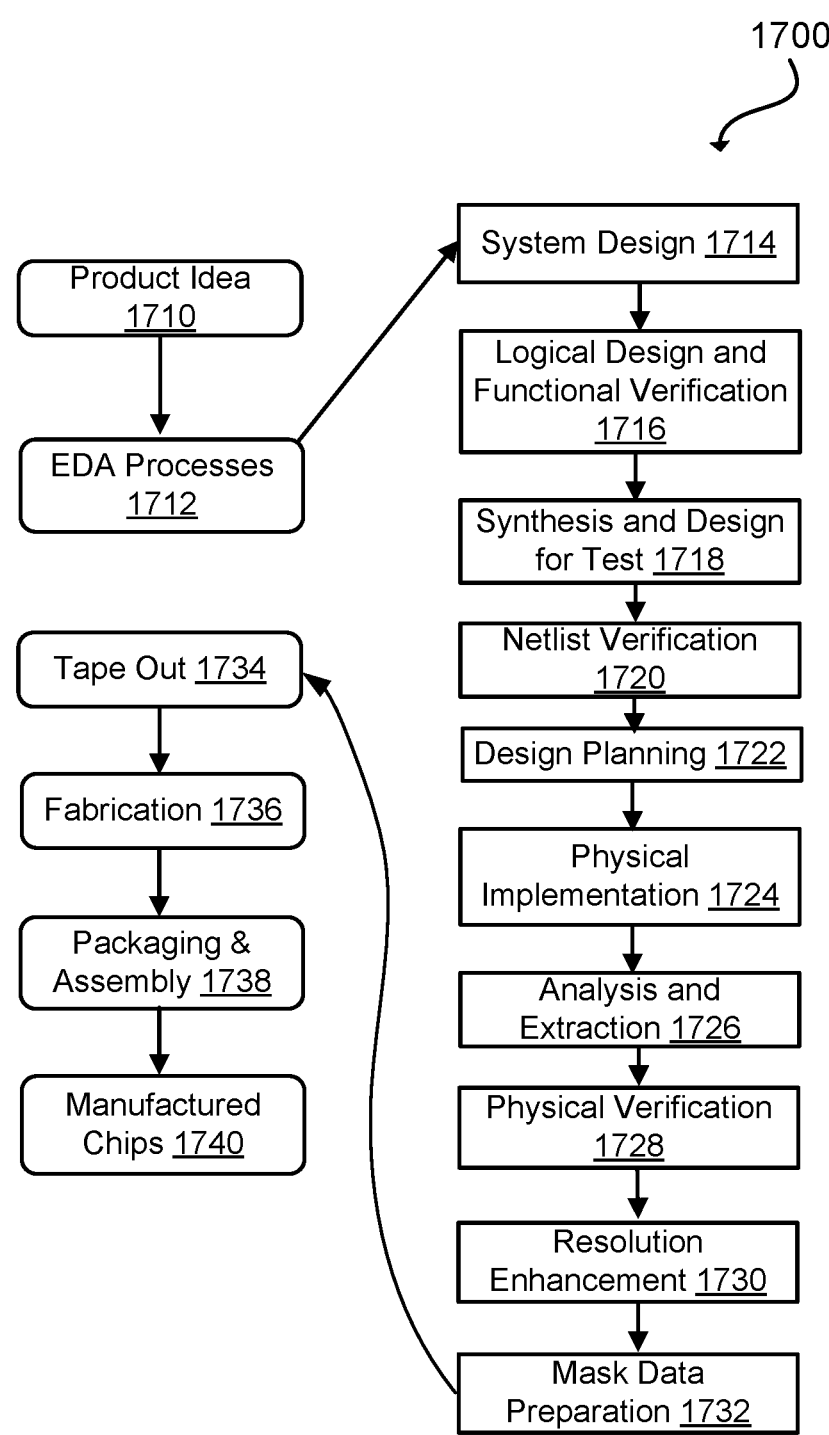
FIG. 17 depicts a flowchart of various processes used during the design and manufacture of an integrated circuit in accordance with some embodiments of the present disclosure.

FIG. 17 illustrates an example set of processes 1700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 1710 with information supplied by a designer, information which is transformed to create an article of manufacture that uses a set of EDA processes 1712. When the design is finalized, the design is taped-out 1734, which is when artwork (e.g., geometric patterns) for the integrated circuit is sent to a fabrication facility to manufacture the mask set, which is then used to manufacture the integrated circuit. After tape-out, a semiconductor die is fabricated 1736 and packaging and assembly processes 1738 are performed to produce the finished integrated circuit 1740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language for specifying more detailed descriptions is SPICE, which is used for detailed descriptions of circuits with many analog components. Descriptions at each level of representation are enabled for use by the corresponding tools of that layer (e.g., a formal verification tool). A design process may use a sequence depicted in FIG. 17. The processes described by be enabled by EDA products (or tools).

During system design 1714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 1716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 1718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 1720, the netlist is checked for compliance with timing constraints and for correspondence with the HDL code. During design planning 1722, an overall floor plan for the integrated circuit is constructed and analyzed for timing and top-level routing.

During layout or physical implementation 1724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 1726, the circuit function is verified at the layout level, which permits refinement of the layout design. During physical verification 1728, the layout design is checked to ensure that manufacturing constraints are correct, such as DRC constraints, electrical constraints, lithographic constraints, and that circuitry function matches the HDL design specification. During resolution enhancement 1730, the geometry of the layout is transformed to improve how the circuit design is manufactured.

During tape-out, data is created to be used (after lithographic enhancements are applied if appropriate) for production of lithography masks. During mask data preparation 1732, the 'tape-out' data is used to produce lithography masks that are used to produce finished integrated circuits.

A storage subsystem of a computer system may be used to store the programs and data structures that are used by some or all of the EDA products described herein, and products used for development of cells for the library and for physical and logical design that use the library.

FIG. 18 illustrates an example machine of a computer system 1800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1800 includes a processing device 1802, a main memory 1804 (e.g., read-only memory (ROM), flash memory, dynamic random access memory (DRAM) such as synchronous DRAM (SDRAM), a static memory 1806 (e.g., flash memory, static random access memory (SRAM), etc.), and a data storage device 1818, which communicate with each other via a bus 1830.

Processing device 1802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1802 may also be one or more special-purpose processing devices such as an application specific integrated circuit (ASIC), a field programmable gate array (FPGA), a digital signal processor (DSP), network processor, or the like. The processing device 1802 may be configured to execute instructions 1826 for performing the operations and steps described herein.

The computer system 1800 may further include a network interface device 1808 to communicate over the network 1820. The computer system 1800 also may include a video display unit 1810 (e.g., a liquid crystal display (LCD) or a cathode ray tube (CRT)), an alphanumeric input device 1812 (e.g., a keyboard), a cursor control device 1814 (e.g., a mouse), a graphics processing unit 1822, a signal generation device 1816 (e.g., a speaker), graphics processing unit 1822, video processing unit 1828, and audio processing unit 1832.

The data storage device 1818 may include a machine-readable storage medium 1824 (also known as a non-transitory computer-readable medium) on which is stored one or more sets of instructions 1826 or software embodying any one or more of the methodologies or functions described herein. The instructions 1826 may also reside, completely or at least partially, within the main memory 1804 and/or within the processing device 1802 during execution thereof by the computer system 1800, the main memory 1804 and the processing device 1802 also constituting machine-readable storage media.

In some implementations, the instructions 1826 include instructions to implement functionality corresponding to the present disclosure. While the machine-readable storage medium 1824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 1802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A method comprising:
receiving one or more assertions or assumptions representing properties of a circuit design;
determining, by a processor, a first alternating Büchi automaton representing based on the one or more assertions or assumptions;
transforming the first alternating Büchi automaton to generate a simplified second alternating Büchi automaton that also represents the one or more assertions or assumptions, wherein the simplified second alternating Büchi automaton has fewer states than the first alternating Büchi automaton, wherein at least one state of the simplified second alternating Büchi automaton is obtained by merging two or more states of the first alternating Büchi automaton, and wherein transforming the first alternating Büchi automaton comprises:
identifying a portion of the first alternating Büchi automaton that is a directed acyclic graph including a state that has an accepting state type; and
responsive to identifying the portion of the first alternating Büchi automaton, changing one or more other states of the portion of the first alternating Büchi automaton from a non-accepting state type to the accepting state type; and
performing formal verification of the circuit design using the simplified second alternating Büchi automaton.

2. The method of claim 1, wherein transforming the first alternating Büchi automaton further comprises:

identifying a feed through state that represents a maximal strongly connected component having a single state with no loops; and
responsive to determining that the feed through state has the non-accepting state type, changing a state type of the feed through state to the accepting state type.

3. The method of claim 1, wherein transforming the first alternating Büchi automaton further comprises:
identifying in the alternating Büchi automaton, a universal transition with one of its targets being a sink state with the accepting state type; and
eliminating the universal transition to the sink state.

4. The method of claim 1, wherein transforming the first alternating Büchi automaton further comprises:
identifying in the first alternating Büchi automaton, a universal transition with one of its targets being a sink state with the non-accepting state type; and
eliminating one or more remaining branches of the universal transition.

5. The method of claim 1, wherein transforming the first alternating Büchi automaton further comprises:
merging a plurality of accepting sink states to a single accepting sink state; and
merging a plurality of non-accepting sink states to a single non accepting sink state.

6. The method of claim 1, wherein transforming the first alternating Büchi automaton further comprises:
identifying an existential transition to a non-accepting sink state; and
eliminating the existential transition to the non-accepting sink state.

7. The method of claim 1, wherein transforming the first alternating Büchi automaton further comprises:
identifying an existential transition having a branch to an accepting sink state; and
eliminating one or more remaining branches of the existential transition.

8. The method of claim 1, wherein transforming the first alternating Büchi automaton further comprises:
identifying a transition having a first branch and a second branch, wherein an accepting condition of the first branch matches an accepting condition of the second branch; and
merging the first branch and the second branch to obtain a single branch.

9. A non-transitory computer readable medium comprising stored instructions, which when executed by a computer processor, cause the computer processor to:
receive one or more assertions or assumptions representing properties of a circuit design;
determine a first alternating Büchi automaton representing the one or more assertions or assumptions;
transform the first alternating Büchi automaton to generate a simplified second alternating Büchi automaton that also represents the one or more assertions or assumptions, wherein the simplified second alternating Büchi automaton has fewer states than the first alternating Büchi automaton, and wherein at least one state of the simplified second alternating Büchi automaton is obtained by merging two or more states of the first alternating Büchi automaton, and wherein transforming the first alternating Büchi automaton comprises:
identifying a portion of the first alternating Büchi automaton that is a directed acyclic graph including a state that has an accepting state type; and
responsive to identifying the portion of the first alternating Büchi automaton, changing one or more other states of the portion of the first alternating Büchi automaton from a non-accepting state type to the accepting state type; and perform formal verification of the circuit design using the simplified second alternating Büchi automaton.

10. The non-transitory computer readable medium of claim 9, wherein instructions for transforming the first alternating Büchi automaton further cause the computer processor to:

identify a feed through state that represents a maximal strongly connected component having a single state with no loops; and responsive to determining that the feed through state has the non-accepting state type, change a state type of the feed through state to the accepting state type.

11. The non-transitory computer readable medium of claim 9, wherein instructions for transforming the first alternating Büchi automaton further cause the computer processor to:

identify in the first alternating Büchi automaton, a universal transition with one of its targets being a sink state with the accepting state type; and eliminate the universal transition to the sink state.

12. The non-transitory computer readable medium of claim 9, wherein instructions for transforming the first alternating Büchi automaton further cause the computer processor to:

identify in the first alternating Büchi automaton, a universal transition with one of its targets being a sink state with the non-accepting state type; and eliminate one or more remaining branches of the universal transition.

13. The non-transitory computer readable medium of claim 9, wherein instructions for transforming the first alternating Büchi automaton further cause the computer processor to:

merge a plurality of accepting sink states to a single accepting sink state; and merge a plurality of non-accepting sink states to a single non accepting sink state.

14. The non-transitory computer readable medium of claim 9, wherein instructions for transforming the first alternating Büchi automaton further cause the computer processor to:

identify an existential transition to a non-accepting sink state; and eliminate the existential transition to the non-accepting sink state.

15. The non-transitory computer readable medium of claim 9, wherein instructions for transforming the first alternating Büchi automaton further cause the computer processor to:

identify an existential transition having a branch to an accepting sink state; and eliminate one or more remaining branches of the existential transition.

16. The non-transitory computer readable medium of claim 9, wherein instructions for transforming the first alternating Büchi automaton further cause the computer processor to:

identify a transition having a first branch and a second branch, wherein an accepting condition of the first branch matches an accepting condition of the second branch; and merge the first branch and the second branch to obtain a single branch.

17. A computer system comprising:

a memory storing instructions; and a processor, coupled with the memory and to execute the instructions, the instructions when executed cause the processor to:

receive one or more assertions or assumptions representing properties of a circuit design;

determine a first alternating Büchi automaton representing the one or more assertions or assumptions;

transform the first alternating Büchi automaton to generate a simplified second alternating Büchi automaton that also represents the one or more assertions or assumptions, wherein the simplified second alternating Büchi automaton has fewer states than the first alternating Büchi automaton, and wherein at least one state of the simplified second alternating Büchi automaton is obtained by merging two or more states of the first alternating Büchi automaton, and wherein transforming the first alternating Büchi automaton comprises:

identifying a portion of the first alternating Büchi automaton that is a directed acyclic graph including a state that has an accepting state type; and responsive to identifying the portion of the first alternating Büchi automaton, changing one or more other states of the portion of the first alternating Büchi automaton from a non-accepting state type to the accepting state type; and perform formal verification of the circuit design using the simplified second alternating Büchi automaton.

18. The computer of claim 17, wherein instructions for transforming the first alternating Büchi automaton cause the computer processor to:

identify a feed through state that represents a maximal strongly connected component having a single state with no loops; and responsive to determining that the feed through state has the non-accepting state type, change the state type of the feed through state to the accepting state type.

\* \* \* \* \*